United States Patent
Konishi

(10) Patent No.: US 7,714,263 B2
(45) Date of Patent: May 11, 2010

(54) SOLID-STATE IMAGE CAPTURING APPARATUS, MANUFACTURING METHOD FOR THE SOLID-STATE IMAGE CAPTURING APPARATUS, AND ELECTRONIC INFORMATION DEVICE

(75) Inventor: Takefumi Konishi, Hiroshima (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 71 days.

(21) Appl. No.: 12/222,207

(22) Filed: Aug. 5, 2008

(65) Prior Publication Data
US 2009/0242741 A1 Oct. 1, 2009

(30) Foreign Application Priority Data
Aug. 6, 2007 (JP) ............................. 2007-204691

(51) Int. Cl.
*H01L 27/00* (2006.01)
(52) U.S. Cl. ................................. 250/208.1; 250/214 R
(58) Field of Classification Search .............. 250/208.1, 250/214 R; 257/290–293, 79, 440–443; 348/294–311
See application file for complete search history.

(56) References Cited

U.S. PATENT DOCUMENTS 7,211,829 B2 * 5/2007 Yasukawa et al. .............. 257/79

FOREIGN PATENT DOCUMENTS

| JP | 2001-332703 | 11/2001 |
| JP | 2004-241638 | 8/2004 |
| JP | 2004-253729 | 9/2004 |
| JP | 2007-073544 | 3/2007 |

OTHER PUBLICATIONS

Chinese Office Action dated Dec. 4, 2009 issued in Chinese Patent Application No. 200810144400.4.

* cited by examiner

*Primary Examiner*—Que T Le
(74) *Attorney, Agent, or Firm*—Edwards Angell Palmer & Dodge LLP

(57) ABSTRACT

A solid-state image capturing apparatus is provided, where each of the pixels comprises a pixel light receiving section for converting incident light into a signal charge by photoelectric conversion, a charge storing section for storing the signal charge and generating a signal voltage in accordance with the stored signal charge, and an amplifying transistor for amplifying and outputting the signal voltage. A second-conductivity type semiconductor region, in which the amplifying transistor is formed, on the semiconductor substrate has an impurity concentration profile different from an impurity concentration profile of a different second-conductivity type semiconductor region, in which a peripheral circuit transistor that constitutes the peripheral circuit is formed.

25 Claims, 14 Drawing Sheets

FIG.3
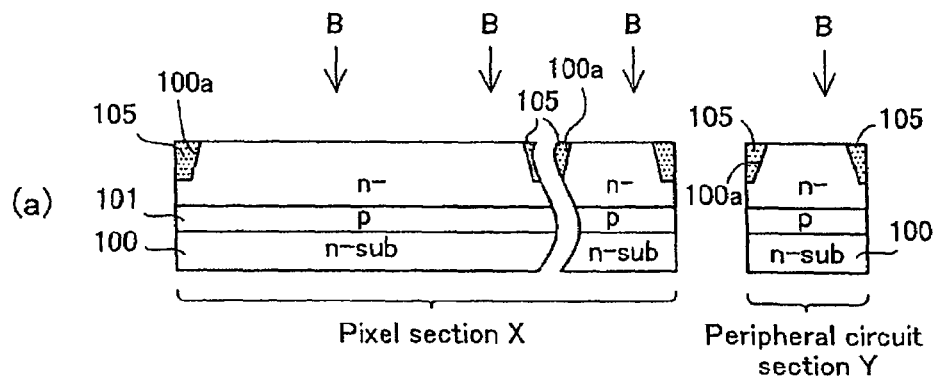
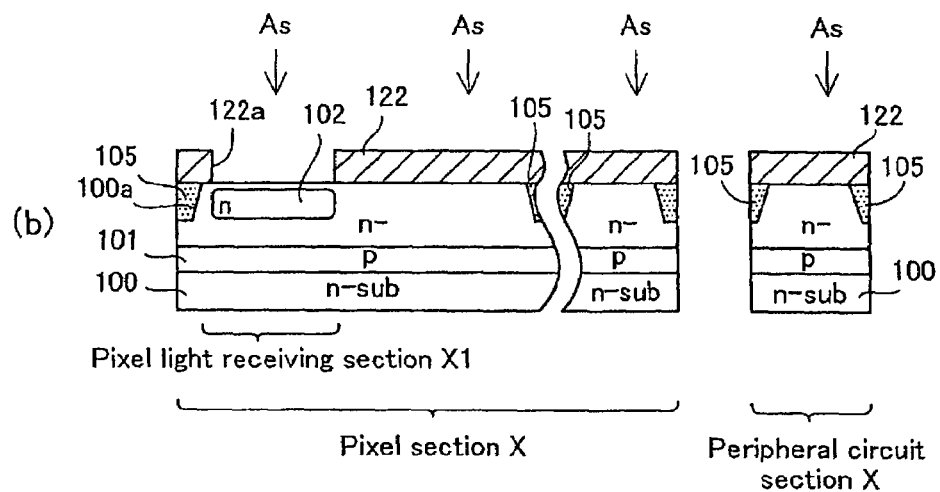

FIG.11
(a)
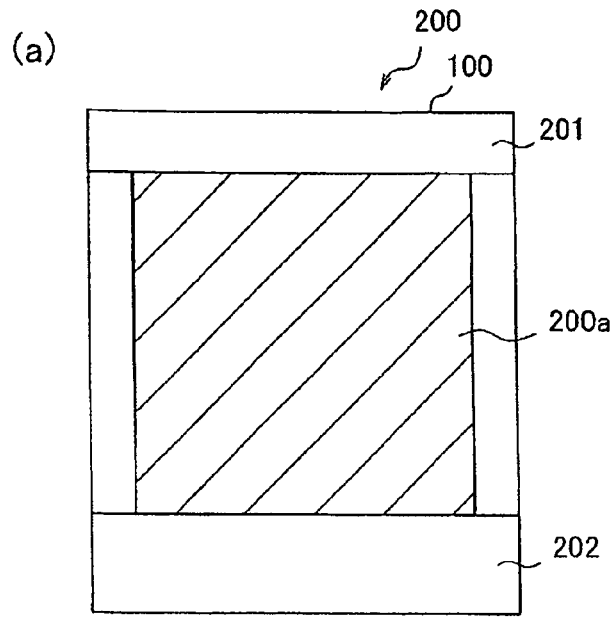
(b)
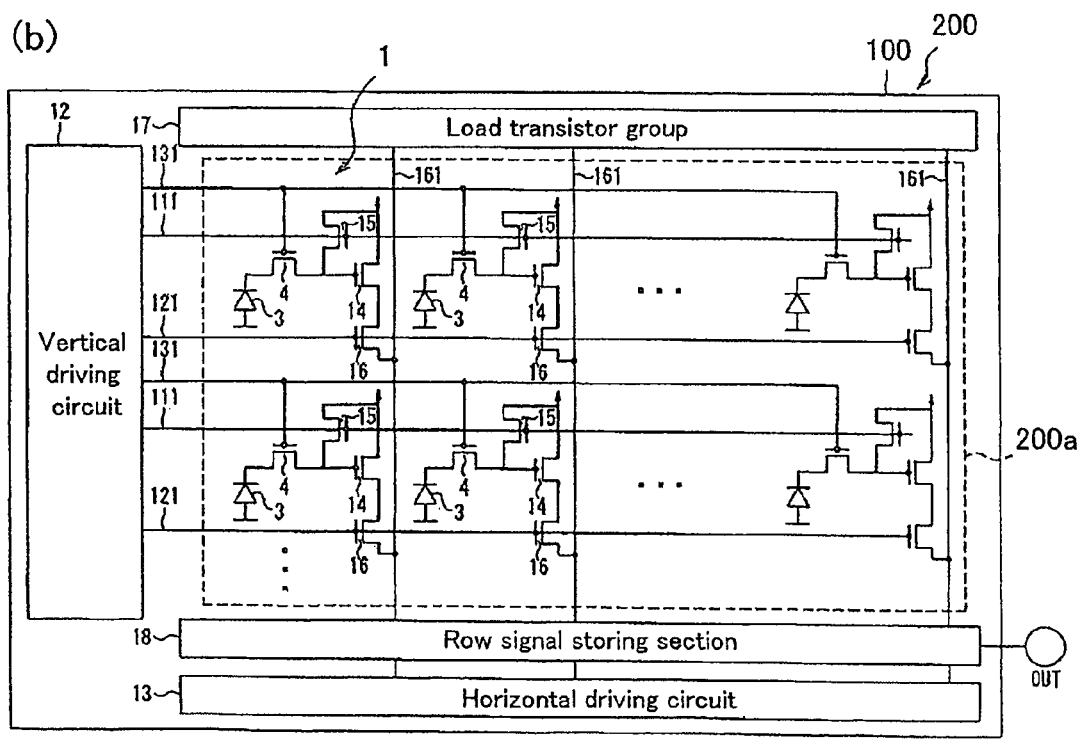

SOLID-STATE IMAGE CAPTURING APPARATUS, MANUFACTURING METHOD FOR THE SOLID-STATE IMAGE CAPTURING APPARATUS, AND ELECTRONIC INFORMATION DEVICE

This Nonprovisional application claims priority under 35 U.S.C. §119(a) on Patent Application No. 2007-204691 filed in Japan on Aug. 6, 2007, the entire contents of which are hereby incorporated by reference.

BACKGROUND OF THE INVENTION

1. Field of the Invention

The present invention relates to a solid-state image capturing apparatus, a manufacturing method of the solid-state image capturing apparatus, and an electronic information device. More particularly, the present invention relates to a solid-state image capturing apparatus that is capable of independently setting a concentration profile of a forming region of an amplifying transistor that constitutes a pixel from a concentration profile of a forming region of a transistor that constitutes a circuit around the pixel, a manufacturing method of such solid-state image capturing apparatus, and an electronic information device having the solid-state image capturing apparatus, such as a digital still camera, a digital video camera and a camera-equipped cell phone device.

2. Description of the Related Art

In recent years, a solid-state image capturing apparatus equipped with an amplifying MOS transistor (referred to as a MOS type solid-state image capturing apparatus, hereinafter) has become an attention in terms of its high sensitivity and the like. The MOS type solid-state image capturing apparatus includes a photodiode and a MOS transistor for each pixel, where the MOS transistor amplifies a signal detected by the photodiode.

A conventional MOS type solid-state image capturing apparatus will be described with reference to FIGS. 11 to 15. FIG. 11(a) is a plan view showing a diagrammatic structure of a conventional MOS type solid-state image capturing apparatus. As shown in FIG. 11(a), a MOS type solid-state image capturing apparatus 200 includes a pixel section 200a formed on a semiconductor substrate 100, and a peripheral circuit sections 201 and 202 formed in the periphery of the pixel section 200a of the semiconductor substrate. The pixel section 200a includes a plurality of pixels (see FIG. 11(b)), and the peripheral circuit sections 201 and 202 include a peripheral circuit for driving pixels.

FIG. 11(b) is a circuit diagram showing one example of a circuit structure of the conventional MOS type solid-state image capturing apparatus. As shown in FIG. 11(b), a plurality of pixels 1 are arranged in a matrix in the pixel section 200a of the MOS type solid-state image capturing apparatus 200.

Each pixel 1 includes a photodiode 3, a transfer transistor 4, an amplifying transistor 14, a reset transistor 15, and a vertical selection transistor 16. The photodiode 3 converts incident light into a signal charge and stores the signal charge. The transfer transistor 4 reads out the signal charge stored in the photodiode 3. The amplifying transistor 14 amplifies the signal charge that is read out by the transfer transistor 4 to convert the signal charge into a signal voltage, and then outputs the signal voltage. The reset transistor 15 resets the signal charge stored in the photodiode 3.

In addition, the peripheral circuit sections 201 and 202 in the MOS type solid-state image capturing apparatus 200 includes a vertical driving circuit 12, horizontal driving circuit 13, a load transistor group 17, and a row signal storing section 18. The vertical driving circuit 12 is connected to gates of the reset transistors 15 of respective horizontal lines via a plurality of reset transistor control lines 111. The reset transistor control lines 111 are arranged horizontally at a regular interval.

In addition, the vertical driving circuit 12 is connected to gates of the transfer transistors 4 for respective horizontal lines via a plurality of transfer transistor control line 131. The transfer transistor control lines 131 are arranged horizontally at a regular interval.

Further, the vertical driving circuit 12 is connected to gates of the vertical selection transistors 16 of respective horizontal lines via a plurality of vertical selection transistor control lines 121. The vertical driving circuit 12 selects a row to read out a signal via the vertical selection transistor control lines 121. Similar to the reset transistor control line 111, each of the vertical selection transistor control lines 121 are arranged horizontally at a regular interval.

The horizontal driving circuit 13 is connected to the row signal storing section 18. The row signal storing section 18 is equipped with a switching transistor for retrieving signals from each row. The row signal storing section 18 and the load transistor group 17 are connected to each other via a vertical signal line 161. Further, the row signal storing section 18 and the load transistor group 17 are connected to a source of the vertical selection transistor 16 via the vertical signal line 161 for every vertical line.

Next, an operation of the solid-state image capturing apparatus shown in FIG. 11 will be described.

First, when the electric potential of a predetermined vertical selection transistor control line 121 is turned to a high level by the vertical driving circuit 12 to select a predetermined row, the vertical selection transistor 16 on the selected row is turned on. In this stage, a source follower circuit is constituted by the amplifying transistor 14 and the load transistor group 17 on the selected row.

Next, when the electric potential of the reset transistor control line 111 on the selected row described above is turned to a high level while the vertical selection transistor 16 in the selected row is in an on-state, the reset transistor 15 on the selected row is turned on and the electric potential of a floating diffusion layer connected to the gate of the amplifying transistor in the selected row is reset.

After the reset transistor 15 on the selected row is turned off and when the electric potential of the transfer transistor control line 131 on the selected row is turned to a high level while the vertical selection transistor 16 is in an on-state, the transfer transistor 4 is turned on and the signal charge stored in the photodiode 3 is transferred to the floating diffusion layer.

In this stage, the gate voltage of the amplifying transistor 14 that is connected to the floating diffusion layer becomes equivalent to the electric potential of the floating diffusion layer, and the voltage of the vertical signal line is substantially equal to the gate voltage of the amplifying transistor 14. Thus, a signal based on the signal charge stored in the photodiode 3 is transferred to the row signal storing section 18.

Subsequently, while the vertical driving circuit 12 selects the next row, the horizontal driving circuit 13 successively outputs the voltage signal of each vertical signal line 161 to the row signal storing section 18. The row signal storing section 18 outputs the voltage signal from each vertical signal line 161 as an output signal to every row.

Next, a specific structure of the solid-state image capturing apparatus shown in FIG. 11 will be described with reference to FIGS. 12 and 13.

FIG. 12 is a plan view showing an enlarged pixel that constitutes the conventional solid-state image capturing apparatus shown in FIG. 11(b). FIG. 13 is a diagram showing a cross sectional structure of the pixel shown in FIG. 12, and more specifically, FIG. 13 shows a diagram of a cross section along the line A-B-C-D shown in FIG. 12. Note that a semiconductor substrate is omitted in FIG. 12.

As shown in FIG. 12, the photodiode 3 is equipped with an n-type semiconductor region 151 formed on the semiconductor substrate 100 (see FIG. 13). In the semiconductor substrate 100, an element separation section 92 is formed between adjacent semiconductor regions 151. In addition, a plurality of n-type semiconductor regions 5a to 5c are horizontally formed in a region adjacent to the semiconductor region 151 of the photodiode 3, with an element separation section 91 arranged therebetween. The semiconductor regions 5a to 5c are arranged vertically. Further, an n-type semiconductor region 154 is formed in a region vertically adjacent to the semiconductor region 151.

In addition, gate electrodes 153a and 153b are respectively formed between the adjacent semiconductor region 5a and semiconductor region 5b, and the adjacent semiconductor region 5b and semiconductor region 5c, via a gate insulation film 156 (see FIG. 13). Further, a gate electrode 152 is formed horizontally and extended between the semiconductor region 151 and semiconductor region 154 via a gate insulation film (not shown). The gate electrode 152 also serves as a transfer transistor control line 131 (see FIG. 11(b)).

In the examples of FIGS. 12 and 13, the transfer transistor 4 is constituted of the gate electrode 152, the semiconductor region 154, the semiconductor region 151 and the gate insulation film (not shown). The transfer transistor 4 utilizes the semiconductor region 151 of the photodiode 3 as a source region. In addition, the reset transistor 15 is constituted of the gate electrode 153a, the semiconductor regions 5a and 5b, the gate insulation film 156. The amplifying transistor 14 is constituted of the gate electrode 153b, the semiconductor regions 5b and 5c, the gate insulation film 156. The reset transistor 15 and the amplifying transistor 14 share the semiconductor region 5b.

In FIG. 12, 155 denotes a wiring. The wiring 155 is connected to the semiconductor region 154, the semiconductor region 5a and the gate electrode 153b via a contact 156a.

As shown in FIGS. 12 and 13, an element separation section is formed in a pixel. As the miniaturization of pixels in the MOS type solid-state image capturing apparatus in resent years, the element separation section is, in many cases, formed by using an STI (Shallow Trench Isolation) method, which forms a trench in a semiconductor substrate.

However, with regard to the element separation section ("STI element separation section" hereinafter) formed by the STI method, there is a problem of causing a crystal defect or stress defect near the element separation section. More particularly, a defect of white dots, namely a white defect, is observed on a playback screen if the crystal defect occurs in the MOS type solid-state image capturing apparatus. Although the number of the dots depends on the STI forming method and the size of the solid-state image capturing apparatus, the number ranges from several to several thousands. Further, when the stress defect occurs in the MOS type solid-state image capturing apparatus, an STI stress defect layer starts to generate a leak current flowing from the element separation section to the photodiode, so that a small and uneven irregularity is observed on a playback screen.

Among such defects, the local dot defect (white defect), which is due to the crystal defect, can be corrected with the advancement of the recent digital technology, so that the dot defect is not a major concern as before. However, it is difficult to correct the small and uneven irregularity by the digital processing due to the STI stress defect layer. This is because a memory with a large capacity is required to correct the irregularity that occurs on the entire screen, thereby increasing the cost of a system to correct the defect.

Therefore, it is proposed to implant an impurity, which has an opposite conductivity with that of a source drain region of the MOS transistor, into a forming region of the STI element separation section to provide an STI leak stopper (see Reference 1, for example). Reference 1 discloses an example of forming an STI leak stopper to surround a side and a bottom of an element separation section. When the STI leak stopper is provided, the leak current can be prevented from flowing from the element separation section to the photodiode, thereby preventing the uneven irregularity from appearing on a display screen.

Herein, the STI leak stopper disclosed in Reference 1 will be described with reference to FIG. 14.

FIG. 14 is a partial cross sectional view showing a manufacturing step of the conventional MOS type solid-state image capturing apparatus having the STI leak stopper formed therein, with FIGS. 14(a) to (d) showing a series of a major step. In FIGS. 14(a) to (d), the left half of the figures shows a pixel section A and the right half of the figures shows a peripheral circuit section B.

In general, both an N-channel MOS transistor and a P-channel MOS transistor are formed on a semiconductor substrate in the MOS type solid-state image capturing apparatus. In FIG. 14(a) to (d), however, only a region (NMOS region) for forming the N-channel MOS transistor is shown.

First, as shown in FIG. 14(a), a trench 701 for forming an STI element region is selectively formed in a forming region of the STI element separation section on the semiconductor substrate 100. Next, a resist film 702 having an opening on a pixel region A is formed, and an impurity is implanted obliquely using the resist film 702 as an ion implantation mask. As a result, an STI leak stopper 703 is formed along the side and the bottom of the trench 701. Herein, the semiconductor substrate 100 is an n-type silicon substrate. Further, a p-type impurity is implanted into the STI leak stopper 703, so that the p-type impurity also serves to separate the two photodiodes that is formed by the n-type impurity.

However, according to this ion implantation step, the p-type impurity is implanted into a region other than the forming region of the STI element separation section, namely, a forming region A1 of a photodiode and a forming region A2 of a transistor (readout transistor) for reading out a signal charge stored in a photodiode. Therefore, the impurity concentration of the well (see FIG. 14(b)) that is formed in the forming region A1 and the forming region A2 is greater than the impurity concentration of the well (see FIG. 14(b)) that is formed in the peripheral circuit section B.

Next, as shown in FIG. 14(b), after the resist film 702 is removed, an insulation, such as a silicon oxide film, is embedded in the trench 701 formed in the substrate described above to form an STI element separation section 704. Next, a resist film 705 is formed, the resist film having an opening on the transistor forming region A2 of the pixel section A and the peripheral circuit section B, and a p-type impurity is implanted obliquely using the resist film 705 as an ion implantation mask. As a result, a p-type well 706 is formed in the transistor forming region A2 of the pixel section A and the peripheral circuit section B.

Next, the p-type impurity is further ion-implanted using the resist film 705 as a mask. As a result, a channel region 707 of a transistor is formed in the transistor forming region A2 and the peripheral circuit section B. In addition, a threshold voltage Vth of a transistor can be controlled by adjusting the impurity concentration in the channel region 707.

Next, as shown in FIG. 14(c), after the resist film 705 is removed, a resist film 709, (shown with a dotted line) having an opening on a portion above the transistor forming region A1, is formed, and an n-type impurity is ion-implanted using the resist film 709 as a mask. As a result, an n-type semiconductor region 710 that constitutes a photodiode is formed. Note that the semiconductor region 710 can also be formed before the channel region 707 is formed.

Next, after the resist film 709 is removed, a gate insulation film 714 that is composed of a silicon oxide film is formed in the transistor forming region A2 and the peripheral circuit section B, and subsequently, a gate electrode 708 that is composed of polysilicon is formed on the insulation film 704.

Next, as shown in FIG. 14(d), forming and etching are performed on the insulation film, and a side wall insulation film (side wall spacer) 711 is formed on the sides of the gate insulation film 714 and the gate electrode 708. Next, a resist pattern 712, having an opening on a portion above the transistor forming region A2 and the peripheral circuit section B, is formed, and an n-type impurity is implanted using the resist pattern 712 as a mask. As a result, a source drain region 713 of a transistor is formed. Subsequently, an interlayer insulation film, various wirings, a microlens and the like are formed to complete the MOS type solid-state image capturing apparatus.

Whereas an n-type semiconductor region is arranged on the surface of the photodiode that constitutes the light receiving section in the solid-state image capturing apparatus disclosed in Reference 1, the conventional solid-state image capturing apparatus also includes a p-type semiconductor layer formed on the surface of the n-type semiconductor region so that an embedded photodiode is formed in the light receiving section.

According to the example shown in FIG. 14, the STI leak stopper 703 is formed, so that the leak current can be prevented from flowing from the element separation section 704 to the photodiode (semiconductor region 710). As a result, the uneven irregularity that appears on a display screen can be controlled.

However, the impurity concentration of the well formed in the pixel section increases if the leak stopper is formed near the element separation section. As a result, a back bias effect tends to occur in a transistor formed on a semiconductor substrate and the output characteristics of a source follower circuit in the MOS type solid-state image capturing apparatus decreases. An explanation with respect to such problems will be described below.

In general, one of the most important parameters in a MOSFET is a threshold voltage $V_T$. An ideal threshold voltage $V_T$ can be given by an equation (1) below. In the equation (1) below, $\in_s$ denotes a dielectric constant of silicon, q denotes a charge amount per one electron, $N_A$ denotes an impurity concentration of a semiconductor substrate, $\psi_B$ denotes a Fermi level, and $C_{OX}$ denotes a gate oxide film capacitance value.

$$V_T = \frac{\sqrt{2\varepsilon_s q N_A (2\varphi_B)}}{C_{OX}} + 2\varphi_B \tag{1}$$

In addition, In the MOSFET, the threshold voltage $V_T$ is influenced by a substrate bias voltage $V_{BS}$. That is, when a voltage in a reverse direction is applied between the semiconductor substrate and the source, the width of the depletion layer is widened and the threshold voltage $V_T$, which is necessary to cause an inversion, is increased. This is referred to a so called back bias effect. The threshold voltage $V_T$ can be expressed using the substrate bias voltage $V_{BS}$ by an equation (2) below. Note that $V_{T0}$ is a threshold voltage when the $V_{BS}$ is 0 (zero).

$$V_T = V_{T0} + \frac{\sqrt{2\varepsilon_s q N_A}}{C_{OX}} (\sqrt{2\varphi_B + V_{BS}} - \sqrt{2\varphi_B}) \tag{2}$$

Herein, the equation (2) described above can be expressed by an equation (4) below when γ is set as shown in an equation (3) below. In the equation (4), the voltage on the right-hand side expresses an error from the ideal output.

$$\gamma = \frac{\sqrt{2\varepsilon_s q N_A}}{C_{OX}} \tag{3}$$

$$V_T - V_{T0} = \gamma(\sqrt{2\varphi_B + V_{BS}} - \sqrt{2\varphi_B}) \tag{4}$$

Further, FIG. 15 is a circuit diagram showing a circuit structure of a basic source follower circuit. The source follower circuit can be used with a low power supply voltage and has a characteristic of a fast response. The source follower circuit is commonly known as a level shift circuit. In FIG. 15, since a transistor $M_A$ is not grounded, the threshold voltage $V_T$ of the transistor $M_A$ is easily influenced by the back bias effect. Electric potentials $V_{in}$, $V_G$ and $V_{OUT}$ shown in FIG. 15 can be expressed by an equation (5) below using the equation (4) described above.

$$V_{in} - V_{out} - V_G = \gamma(\sqrt{2\Phi_B + V_{out}} - \sqrt{2\Phi_B}) \tag{5}$$

Further, in the source follower circuit shown in FIG. 15, a voltage gain $A_v$ ($=V_{out}/V_{in}$) can be expressed by an equation (6) based on the equation (5) described above.

$$A_V = \frac{1}{1 + \frac{\gamma}{2\sqrt{2\sqrt{2\varphi_B + V_{out}}}}} \tag{6}$$

From the equation (6) described above, AV≈1 when the value for γ is small. In addition, from the equation (6) described above, the larger the value for γ, the linearity of the source follower circuit is further decreased and the voltage gain becomes smaller. Based on this fact, the linearity of the source follower circuit can be increased by decreasing the value for γ, In addition, the voltage gain can be increased by decreasing the value for γ, and therefore, the dynamic range of the MOS type solid-state image capturing apparatus can be expanded in the MOS type solid-state image capturing apparatus.

From the equation (3) described above, it is understood that an impurity concentration $N_A$ of the semiconductor substrate can be decreased so as to decrease the value for γ. Therefore, the output characteristics of the source follower circuit can be improved by diluting the concentration of the well formed in the pixel region.

However, as described above, the impurity concentration of the well formed in the pixel region increases if a leak stopper is formed near the element separation section. Therefore, it will be difficult to improve the linearity of the source follower circuit and to expand the dynamic range.

In order to solve such problems, a method for counter doping an impurity, which has the opposite conductivity with the conductivity of the well, directly under the gate of the output transistor, which constitutes the source follower circuit (see Reference 2, for example). According to the method disclosed in Reference 2, the linearity of the source follower circuit can be improved and the dynamic range can be expanded because the impurity concentration $N_A$ of the semiconductor substrate can be decreased. In addition, the variation of threshold voltage $V_T$ can be controlled because the impurity concentration can be decreased in the surface layer of the well. As a result, the back bias effect in the transistor can also be controlled.

Reference 1: Japanese Laid-Open Publication No. 2004-253729

Reference 2: Japanese Laid-Open Publication No. 2004-241638

SUMMARY OF THE INVENTION

However, the implantation of impurity ions with a different conductivity is performed several times in the counter doping disclosed in Reference 2, and the variations of the impurity concentrations are multiplied, causing the multiplied total variation to be so large. Furthermore, it is difficult to provide the n-type impurity and the p-type impurity with the same amount to completely counteract each other, thereby causing another problem where the threshold voltage $V_T$ varies according to the degree of the counteract. As a result, a sufficient control for the back bias effect can not be performed by the method disclosed in Reference 2.

Further, such a phenomenon occurs when the threshold voltage $V_T$ is increased, even with the same structure, by performing a well implantation in the pixel region section with a minute pattern, and it becomes a significant problem.

The present invention is intended to solve the conventional problems described above. The objective of the present invention is to provide a solid-state image capturing apparatus, where the concentration of a well, in which a transistor that constitutes a pixel is arranged, can be set without influencing a peripheral circuit transistor forming step, and a leak stopper prevents a leak current from flowing from an element separation section to a photodiode so as to control the uneven display irregularity while improving the output characteristics of a source follower circuit. The objective of the present invention is to also provide a manufacturing method of the solid-state image capturing apparatus, and an electronic information device using the solid-state image capturing apparatus.

A solid-state image capturing apparatus according to the present invention includes a first-conductivity type semiconductor substrate; a pixel section obtained by forming a plurality of pixels on the semiconductor substrate; and a peripheral circuit section obtained by forming a peripheral circuit for driving the pixels in a region of the semiconductor substrate, the region being located around the pixel section, in which each of the pixels includes: a pixel light receiving section for converting incident light into a signal charge by photoelectric conversion; a charge storing section for storing the signal charge and generating a signal voltage in accordance with the stored signal charge; and an amplifying transistor for amplifying and outputting the signal voltage, in which the semiconductor substrate includes a second-conductivity type semiconductor region, in which the amplifying transistor is formed, the second-type semiconductor region having an impurity concentration profile different from an impurity concentration of a second-conductivity type semiconductor region, in which a peripheral circuit transistor that constitutes the peripheral circuit is formed.

Preferably, in a solid-state image capturing apparatus according to the present invention, the second-conductivity type semiconductor region, in which the amplifying transistor is formed, on the semiconductor substrate has an impurity concentration lower than an impurity concentration of the second-conductivity type semiconductor region, in which the peripheral circuit transistor that constitutes the peripheral circuit is formed.

Still preferably, in a solid-state image capturing apparatus according to the present invention, each of the pixels has a reset transistor for resetting a signal charge stored in the charge storing section, and a second-conductivity type semiconductor region, in which the reset transistor is formed, on the semiconductor substrate is formed with the same ion implantation treatment for the second-conductivity type semiconductor region, in which a peripheral circuit transistor that constitutes the peripheral circuit is formed.

Still preferably, in a solid-state image capturing apparatus according to the present invention, the semiconductor substrate includes an element separation section formed by embedding an insulation material in a trench formed on the surface of the semiconductor substrate, and a second-conductivity type leak stopper formed in the semiconductor substrate to cover a side and a bottom of the element separation section for preventing a leak current from flowing from the element separation section to a peripheral semiconductor region thereof, and the second-conductivity semiconductor region, in which the amplifying transistor is arranged, is formed with the same ion implantation treatment for the second-conductivity type leak stopper.

Still preferably, in a solid-state image capturing apparatus according to the present invention, each of the pixels has a transfer transistor formed between the pixel light receiving section and the charge storing section for transferring a signal charge generated in the pixel light receiving section to the charge storing section, and a second-conductivity type semiconductor region, which constitutes a channel region of the transfer transistor, on the semiconductor substrate has an impurity concentration profile different from the impurity concentration profile of the second-conductivity type semiconductor region, in which the reset transistor is formed.

Still preferably, in a solid-state image capturing apparatus according to the present invention, each of the pixels has a reset transistor for resetting a signal charge stored in the charge storing section, and a second-conductivity type semiconductor region, in which the reset transistor is formed, on the semiconductor substrate has an impurity concentration profile different from the impurity concentration profile of the second-conductivity type semiconductor region, in which the peripheral circuit transistor that constitutes the peripheral circuit is formed, and different from the impurity concentration profile of the second-conductivity type semiconductor region, in which the amplifying transistor is formed.

Still preferably, in a solid-state image capturing apparatus according to the present invention, the semiconductor substrate includes an element separation section formed by embedding an insulation material in a trench formed on the surface of the semiconductor substrate, and a second-conductivity type leak stopper formed in the semiconductor substrate so as to cover sides and a bottom of the element separation section, for preventing a leak current from flowing from the element separation section to a peripheral semiconductor region, and the second-conductivity semiconductor region, in which the amplifying transistor is formed, is formed with the same ion implantation treatment for the second-conductivity type leak stopper.

Still preferably, in a solid-state image capturing apparatus according to the present invention, each of the pixels has a transfer transistor formed between the pixel light receiving section and the charge storing section, for transferring a signal charge generated in the pixel light receiving section to the charge storing section, and a channel region of the transfer transistor is formed in the second-conductivity type semiconductor region in which the reset transistor is formed.

Still preferably, in a solid-state image capturing apparatus according to the present invention, a transistor in the pixel section constitutes an analog signal processing circuit, and the peripheral circuit transistor in the peripheral circuit section constitutes a digital signal processing circuit.

Still preferably, in a solid-state image capturing apparatus according to the present invention, the first-conductivity type semiconductor substrate is an n-type silicon substrate doped with phosphorus, and the second-conductivity type semiconductor region is a p-type semiconductor region implanted with boron.

A manufacturing method for a solid-state image capturing apparatus according to the present invention is provided, the solid-state image capturing apparatus including a pixel section, which includes a plurality of pixels, and a peripheral circuit section, which includes a peripheral circuit for driving the pixel, each of the pixels comprising a pixel light receiving section for converting incident light into a signal charge by photoelectric conversion; a charge storing section for storing the signal charge and generating a signal voltage in accordance with the stored signal charge; and an amplifying transistor for amplifying and outputting the signal voltage, the manufacturing method including a first ion implantation step of selectively ion-implanting a second-conductivity type impurity in a surface region of a first-conductivity type semiconductor substrate so as to form a first second-conductivity type semiconductor region, in which the amplifying transistor is to be formed; and a second ion implantation step of selectively ion-implanting the second-conductivity type impurity in the surface region of the first-conductivity type semiconductor substrate with an ion implantation condition that is different from the first ion implantation step, so as to form a second second-conductivity type semiconductor region in which a peripheral circuit transistor that constitutes the peripheral circuit is to be formed, thereby achieving the objective described above.

Preferably, in a manufacturing method for a solid-state image capturing apparatus according to claim 11, a first ion implantation mask is used in the first ion implantation step; and a second ion implantation mask, which has a mask opening pattern different from a mask opening pattern of the first ion implantation mask, is used in the second ion implantation step.

Still preferably, in a manufacturing method for a solid-state image capturing apparatus according to the present invention, the first second-conductivity type semiconductor region, in which the amplifying transistor is to be formed, has an impurity concentration profile that is different from an impurity concentration profile of the second second-conductivity type semiconductor region, in which the peripheral circuit transistor is to be formed.

Still preferably, in a manufacturing method for a solid-state image capturing apparatus according to the present invention, the first second-conductivity type semiconductor region, in which the amplifying transistor is to be formed, has the impurity concentration profile lower than the impurity concentration profile of the second second-conductivity type semiconductor region, in which the peripheral circuit transistor is to be formed.

Still preferably, in a manufacturing method for a solid-state image capturing apparatus according to the present invention, each of the pixels has a reset transistor for resetting a signal charge stored in the charge storing section, and the second ion implantation step forms a third second-conductivity type semiconductor region, in which the reset transistor is to be formed, with the same ion implantation condition for the second second-conductivity type semiconductor region, in which the peripheral circuit transistor is to be formed, and using the same ion implantation mask.

Still preferably, a manufacturing method for a solid-state image capturing apparatus according to the present invention further includes an element separation step of forming a trench selectively on the surface of the semiconductor substrate and embedding an insulation material in the trench to form an element separation section, in which the first ion implantation step forms, in the semiconductor substrate, a second-conductivity type leak stopper which covers sides and a bottom of the element separation section and the first second-conductivity type semiconductor region, in which the amplifying transistor is to be formed, with the same ion implantation condition and using the same ion implantation mask.

Still preferably, in a manufacturing method for a solid-state image capturing apparatus according to the present invention, each of the pixels has a transfer transistor formed between the pixel light receiving section and the charge storing section, and for transferring a signal charge generated in the pixel light receiving section to the charge storing section, and the method including a third ion implantation step of forming a fourth second-conductivity type semiconductor region, which constitutes a channel region of the transfer transistor, using an ion implantation mask that is different from the ion implantation masks used in any of the first and second ion implantation steps.

Still preferably, in a manufacturing method for a solid-state image capturing apparatus according to the present invention, the fourth second-conductivity type semiconductor region, which constitutes the channel region of the transfer transistor, has an impurity concentration profile that is different from the impurity concentration profile of the third second-conductivity type semiconductor region, in which the reset transistor is to be formed.

Still preferably, in a manufacturing method for a solid-state image capturing apparatus according to the present invention, each of the pixels has a reset transistor for resetting a signal charge stored in the charge storing section, and the method including a fourth ion implantation step of forming a third second-conductivity type semiconductor region, in which the reset transistor is to be formed, using an ion implantation mask that is different from the ion implantation masks used in any of the first and second ion implantation steps.

Still preferably, in a manufacturing method for a solid-state image capturing apparatus according to the present invention, the third second-conductivity type semiconductor region, in which the reset transistor is to be formed, has an impurity concentration profile that is different from an impurity concentration profile of the second second-conductivity type semiconductor region, in which the peripheral circuit transistor is to be formed, and different from an impurity concentration profile of the first second-conductivity type semiconductor region, in which the amplifying transistor is to be formed.

Still preferably, a manufacturing method for a solid-state image capturing apparatus according to the present invention, further includes an element separation step of selectively forming a trench on the surface of the semiconductor substrate and embedding an insulation material in the trench to form an element separation section, in which the first ion implantation step forms, in the semiconductor substrate, a second-conductivity type leak stopper which covers sides and a bottom of the element separation section and a first second-conductivity type semiconductor region, in which the amplifying transistor is to be formed, with the same ion implantation condition and using the same ion implantation mask.

Still preferably, in a manufacturing method for a solid-state image capturing apparatus according to the present invention, each of the pixels has a transfer transistor formed between the pixel light receiving section and the charge storing section for transferring a signal charge generated in the pixel light receiving section to the charge storing section, and the fourth ion implantation step forms the third second-conductivity type semiconductor region, in which the reset transistor is to be formed, in such a manner that the third second-conductivity type semiconductor region includes a channel region of the transfer transistor.

Still preferably, in a manufacturing method for a solid-state image capturing apparatus according to the present invention, the transistor in the pixel section constitutes an analog signal processing circuit, and the peripheral circuit transistor in the peripheral circuit section constitutes a digital signal processing circuit.

Still preferably, in a manufacturing method for a solid-state image capturing apparatus according to the present invention, the first-conductivity type semiconductor substrate is an n-type silicon substrate doped with phosphorus, and the second-conductivity type semiconductor region is a p-type semiconductor region implanted with boron.

Still preferably, in a manufacturing method for a solid-state image capturing apparatus according to the present invention, a solid-state image capturing apparatus according to the present invention is used as the image capturing section.

The functions of the present invention having the structures described above will be described hereinafter.

According to the present invention, a second-conductivity semiconductor region, where an amplifying transistor that constitutes a pixel is formed, on a first-conductivity semiconductor substrate has an impurity concentration profile that is different from an impurity concentration profile of a different second-conductivity semiconductor region, where a peripheral circuit transistor that constitutes a peripheral circuit is formed. Therefore, it is possible to independently set an impurity concentration profile of an amplifying transistor, which constitutes an analog circuit in a pixel, and a peripheral circuit transistor, which constitutes a digital circuit, and it is possible for the amplifying transistor in the pixel to have a characteristic different from that of the peripheral circuit transistor. As a result, it is possible to improve the linearity of the source follower circuit formed by the amplifying transistor and to expand the dynamic range.

In addition, the semiconductor substrate according to the present invention includes an element separation section, which is formed by embedding an insulation material in a trench that is formed on the surface of the semiconductor substrate, and a second-conductivity leak stopper, which is formed inside the semiconductor substrate to cover the side and the bottom of the element separation section, for preventing a leak current from flowing from the element separation section to a peripheral semiconductor region. Therefore, it is possible to prevent the leak current from flowing from the element separation section to the photodiode by the leak stopper, so that the uneven display irregularity is controlled. Further, an ion implantation step can be simplified because the second-conductivity semiconductor region, where the amplifying transistor is arranged, is formed by the same ion implantation treatment for the second-conductivity leak stopper. In addition, the region for implanting the well in the pixel section can be expanded. Further, the well is implanted into the pixel section with a minute pattern, so that the phenomenon of increasing the threshold voltage $V_T$ can be controlled. In such a case, the impurity concentration of the second-conductivity semiconductor region, where the amplifying transistor is arranged, becomes similar to the impurity concentration of the second-conductivity leak stopper, and the deterioration of the output characteristic of the amplifying transistor can be avoided, due to unnecessary increase on the impurity concentration of the second-conductivity semiconductor region, where the amplifying transistor is arranged.

In addition, the ion implantation step according to the present invention can be simplified because both an arrangement region (p-type well) for a reset transistor and an arrangement region (p-type well) for a peripheral circuit transistor in a peripheral circuit section are formed by the same ion implantation step using the same ion implantation mask.

In addition, the ion implantation step according to the present invention can be simplified because the well, which is a third second-conductivity semiconductor region for forming a reset transistor, is formed such that the third second-conductivity semiconductor region includes a channel region of a transfer transistor.

According to the present invention with the structures described above, the impurity concentration profile of a forming region of an amplifying transistor that constitutes a pixel is set to be different from the concentration profile of a forming region of a transistor that constitutes a circuit around the pixel. As a result, the leak stopper prevents the leak current from flowing from the element separation section to the photodiode so as to control the uneven display irregularity while obtaining an effect to avoid the deterioration of the output characteristic of the amplifying transistor.

These and other advantages of the present invention will become apparent to those skilled in the art upon reading and understanding the following detailed description with reference to the accompanying figures.

BRIEF DESCRIPTION OF THE DRAWINGS

FIG. 1(a) shows a structure of a pixel in a plan view, and FIG. 1(b) shows a cross sectional structure along the line IA-IA' in FIG. 1(a), a cross sectional structure along the line IB-IB' in FIG. 1(a), and a cross sectional structure of a peripheral circuit transistor in a peripheral circuit section.

FIG. 3 is a cross sectional view illustrating a manufacturing method for the solid-state image capturing apparatus according to Embodiment 1, showing a step of forming an embedded p-type diffusion layer (FIG. 3(a)) and a step of forming an n-type diffusion region that constitutes a pixel light receiving section (FIG. 3(b)).

FIG. 8(a) shows a structure of a pixel in a plan view, and FIG. 8(b) shows a cross sectional structure along the line IIA-IIA' in FIG. 8(a), a cross sectional structure along the line IIB-IIB' in FIG. 8(a), and a cross sectional structure of a peripheral circuit transistor in a peripheral circuit section.

FIG. 11 is a diagram showing a conventional MOS type solid-state image capturing apparatus. FIG. 11(a) shows a diagrammatic structure of the conventional MOS type solid-state image capturing apparatus. FIG. 11(b) shows one example of the circuit structure of the conventional MOS type solid-state image capturing apparatus.

FIGS. 14(a) to 14(d) shows a series of major steps.

Figure 1:
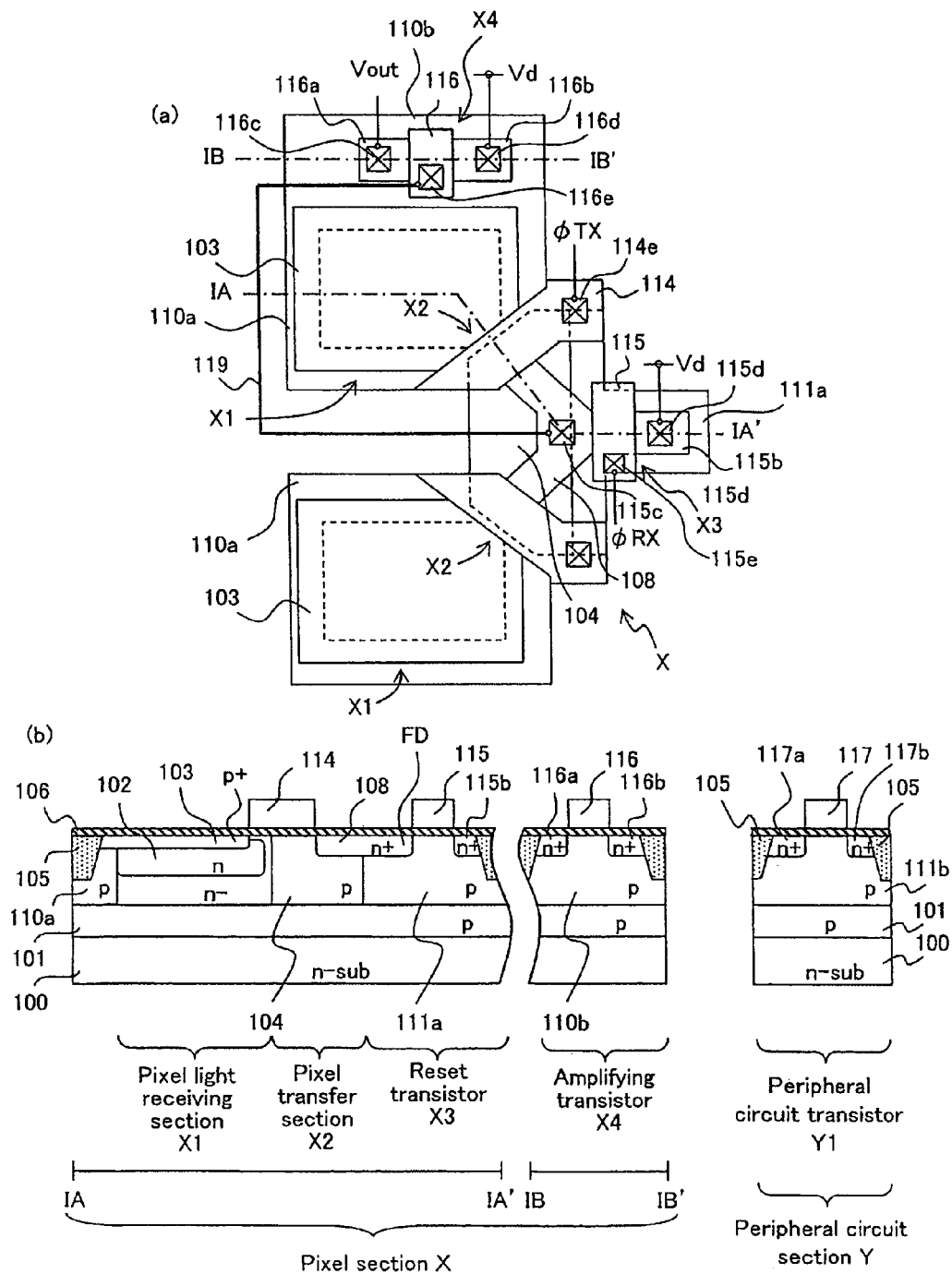
FIG. 1 is a diagram illustrating a solid-state image capturing apparatus according to Embodiment 1 of the present invention.
Figure 2:
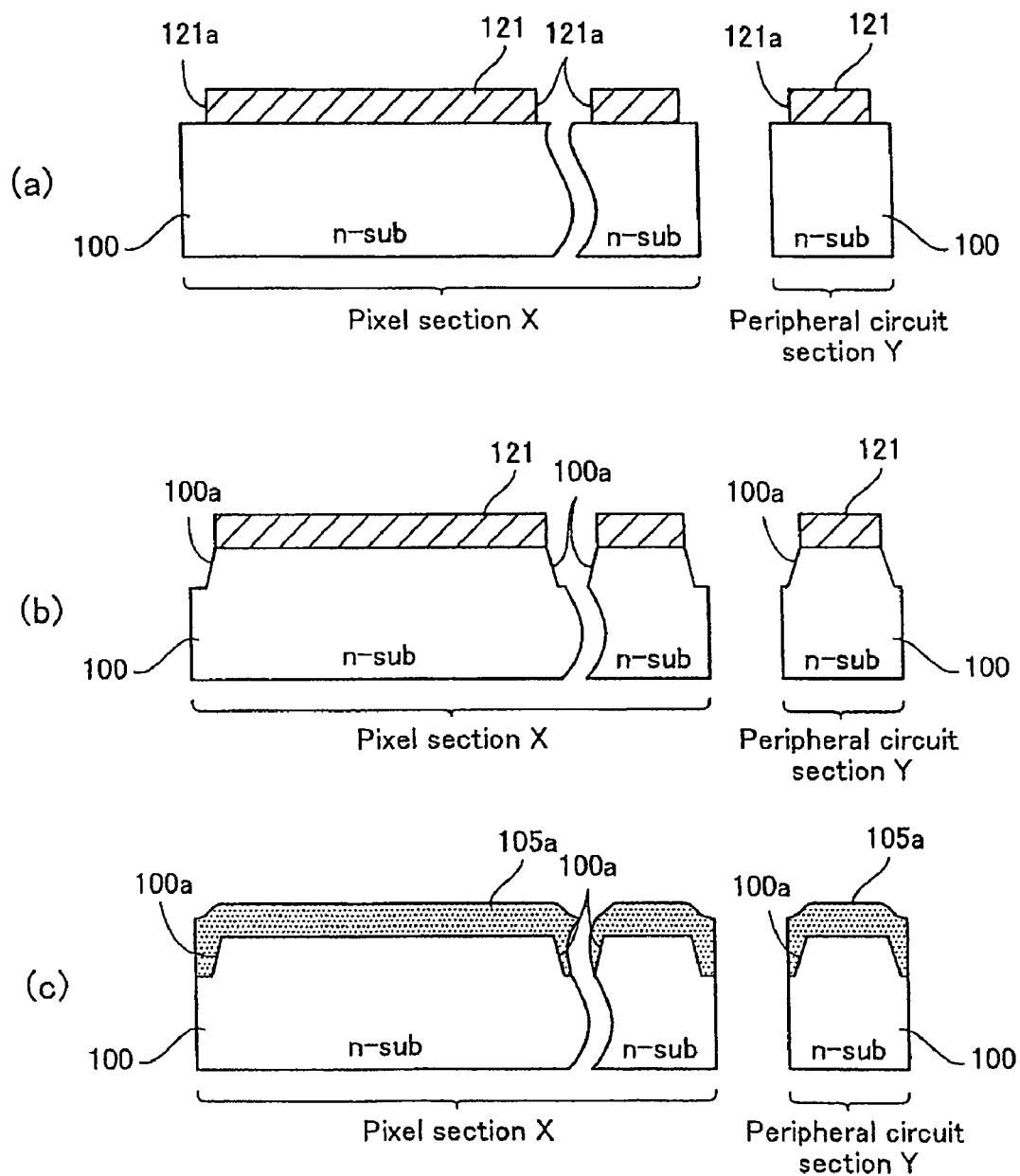
FIG. 2 is a cross sectional view illustrating a manufacturing method for the solid-state image capturing apparatus according to Embodiment 1, showing steps of processes of forming an element separation section on a surface of a substrate in an order form FIG. 2(a) to FIG. 2(c)
Figure 4:
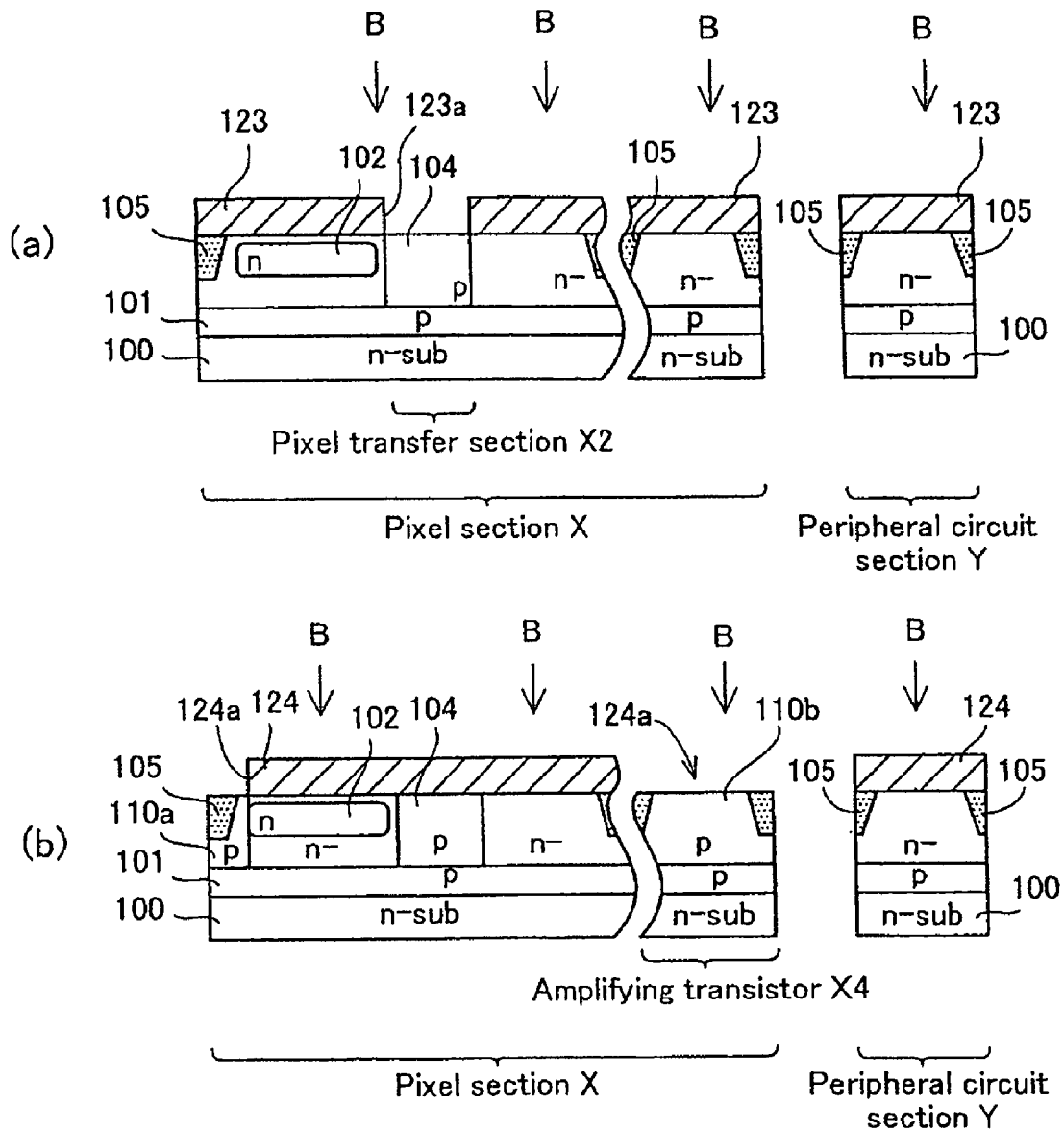
FIG. 4 is a cross sectional view illustrating a manufacturing method for the solid-state image capturing apparatus according to Embodiment 1, showing a step of forming a well that constitutes a pixel transfer section (FIG. 4(a)) and a step of forming a well for arranging an amplifying transistor (FIG. 4(b)).
Figure 5:
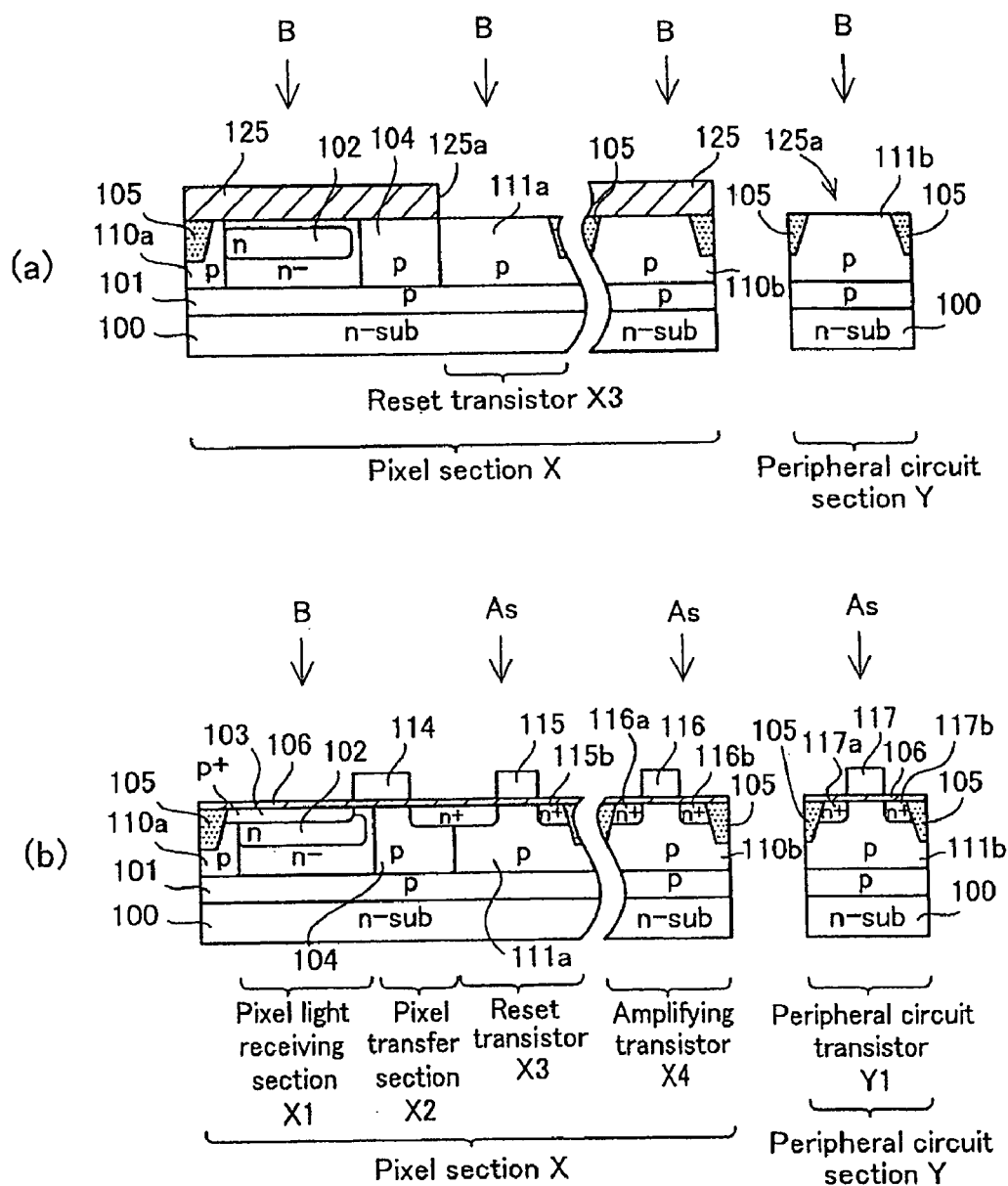
FIG. 5 is a cross sectional view illustrating a manufacturing method for the solid-state image capturing apparatus according to Embodiment 1, showing a step of forming a well for arranging a reset transistor (FIG. 5(a)) and a step of forming a p-type diffusion region that constitutes a gate electrode and a diffusion region of the transistor, and a pixel light receiving section (FIG. 5(b)).

100 n-type semiconductor substrate
101 p-type embedded semiconductor layer
102 n-type semiconductor layer
103 p+ type semiconductor layer
104, 104a, 110b, 111, 111a, 111b p-type semiconductor region
105 element separation section
106 gate insulation film
108 floating diffusion (n+ diffusion region)
110a leak stopper
114 transfer gate
114e, 115c-115e, 116c, 116d contact hole
115 reset Tr gate
115b, 116b, 117b drain region
116 amplifying Tr gate
116a, 117a source region
117 peripheral Tr gate
121-125, 223-225 resist film
121a, 122a, 123a, 124a, 125a, 223a, 234a, 225a resist opening
X pixel section
X1 pixel light receiving section
X2 pixel transfer section
X3 reset transistor
X4 amplifying transistor
Y peripheral circuit section
Y1 peripheral circuit transistor

DESCRIPTION OF THE PREFERRED EMBODIMENTS

Embodiments of the present invention will be described hereinafter.

Embodiment 1

FIG. 1 is a diagram illustrating a solid-state image capturing apparatus according to Embodiment 1 of the present invention. FIG. 1(a) shows a structure of a pixel in a plan view, and FIG. 1(b) shows a cross sectional structure along the line IA-IA' in FIG. 1(a), a cross sectional structure along the line IB-IB' in FIG. 1(a), and across sectional structure of a peripheral circuit transistor in a peripheral circuit section.

Similar to the conventional solid-state image capturing apparatus 200, the solid-state image capturing apparatus according to Embodiment 1 also includes a pixel section X, in which pixels are arranged in a matrix, and a peripheral circuit section Y arranged in the periphery of the pixel section X and for driving each pixel in the pixel section.

Each pixel that constitutes the pixel section X according to Embodiment 1 includes: a pixel light receiving section X1 for receiving incident light to generate a signal charge; a pixel transfer section X2 for transferring the signal charge to a charge storing section (floating diffusion section) FD; a reset transistor section X3 for resetting an electric potential of the charge storing section FD to a reset electric potential; and an amplifying transistor X4 for converting the signal charge of the charge storing section FD into a voltage signal, amplifying and outputting the voltage signal.

The pixel light receiving section X1 described above is a photodiode that is constituted of an n-type diffusion layer 102 formed in a surface region of an n-type semiconductor substrate 100, and a p+ type diffusion layer formed on the n-type diffusion layer 102. Herein, an Si substrate doped with phosphorus (P) is used as the n-type semiconductor substrate 100, and the substrate has an impurity concentration of about $1 \times 10^{14}$ to $1 \times 10^{15}/cm^{-3}$. In addition, the photodiodes that constitutes each pixel are electrically separated by an element separation section 105 (also referred to as an element separation region, hereinafter). The element separation section 105 is formed by embedding an insulation material such as silicon oxide in a trench formed on a surface of the semiconductor substrate 100, and the side and the bottom of the element separation section 105 are covered by a p-type diffusion layer 110a functions as a leak stopper so as to prevent a leak current from flowing from the element separation section 105 to the photodiode. The p-type diffusion layer 110a functioning as a leak stopper reaches a p-type embedded semiconductor layer 101, which is formed deeply in the semiconductor substrate 100 so as to completely deplete the n-type diffusion layer 102.

The pixel transfer section X2 described above includes a transfer gate 114, which is formed on a surface of the semiconductor substrate 100, with a gate insulation film 106 therebetween, and a transfer transistor having a source region and a drain region that are located on both sides of the transfer gate 114. The source region of the transfer transistor is constituted of a portion of the n-type diffusion layer 102, and the drain region of the transfer transistor is constituted of a portion of an n+ type diffusion layer 108. A p-type well 104, which includes a channel region, is formed below the transfer gate 114, and the p-type well reaches the p-type embedded semiconductor layer 101 described above from the substrate surface. The n+ type diffusion layer 108, which constitutes the drain region of the transfer transistor, constitutes the charge storing section FD that stores a signal charge. In addition, the transfer gate 114 is connected to a driving signal line of the transfer gate via a contact hole 114e, and a driving signal $\phi$ TX is applied to the transfer gate.

The reset transistor X3 includes a reset Tr gate 115 formed on the surface of the semiconductor substrate 100 via the gate insulation film 106, and a source region and a drain region, both of which are located on both sides of the reset Tr gate 115. The drain region of the reset transistor X3 is constituted by a n+ type diffusion layer 115b, and the source region of the reset transistor X3 is constituted by a portion of the n+ type diffusion layer 108 described above. A p-type well 111a, which includes a channel region, is formed below the reset Tr gate 115, and the p-type well 111a reaches the p-type embedded semiconductor layer 101 described above from the substrate surface. Further, the source region (n+ type diffusion layer 108) of the reset transistor X3 is connected to a wiring layer 119 via a contact hole 115c. The drain region (n+ type diffusion layer 115b) of the reset transistor X3 is connected to a power supply Vd via a contact hole 115d. The gate 115 of the reset transistor X3 is connected to the driving signal line (not shown) via a contact hole 115e, and a driving signal $\phi$ RX is applied to the gate 115.

The amplifying transistor X4 includes an amplifying Tr gate 116 formed on the surface of the semiconductor substrate 100 via a gate insulation film 106, and a source region 116a and a drain region 116b, both of which are located on both sides of the amplifying Tr gate 116. A p-type well 110b, which includes a channel region, is formed below the source region 116a, and the p-type well 110b is formed by the same step for the p-type diffusion layer 110a functioning as a leak stopper, and the p-type well 110b is incorporated with the p-type diffusion layer 110a. The p-type well 110b reaches the p-type embedded semiconductor layer 101 from the substrate surface. Therefore, it is needless to say that the p-type well 110b has substantially the same concentration profile as that of the p-type diffusion layer 110a. The source region 116a and the drain region 116b of the amplifying transistor X4 are constituted by the n+ type diffusion layer. The drain region 116b is connected to the power supply Vd via a contact hole 116d, and the source region 116a is connected via a contact hole 116c to an output terminal Vout for converting a signal charge into a voltage signal to output the voltage signal. The output terminal Vout of the amplifying transistor is connected to a readout signal line (not shown) for reading out a pixel signal, via a selection transistor (see FIG. 11(b)). The readout signal line corresponds to the vertical signal line 161 shown in FIG. 11(b). In addition, the gate 116 of the amplifying transistor X4 is connected via a contact hole 116e to the source of the reset transistor described above, namely a wiring layer 119 connected to a charge storing section 108.

On the other hand, similar to the conventional solid-state image capturing apparatus, the peripheral circuit section Y described above, includes a circuit structure for driving each pixel in the pixel section. Although not shown in FIG. 1, the peripheral circuit section Y includes a vertical driving circuit, horizontal driving circuit, a load transistor group, and a row signal storing section as shown in FIG. 11(b).

The peripheral circuit transistor Y arranged in the peripheral circuit section Y is formed in the p+ type well 111b on the p-type embedded semiconductor layer 101 formed on the semiconductor substrate 100 described above. That is, the peripheral circuit transistor Y includes a gate 117 formed on a surface of the well 111b via the gate insulation film 106, and n+ type diffusion regions 117a and 117b formed in the p-type well surface region on both sides of the gate 117. The p-type well 111b, which includes a channel of a peripheral circuit transistor Y1, is formed by the same step for the p-type well 111a, which constitutes the reset transistor X3 of the pixel section X described above, and has the same concentration profile as that of the well 111a of the reset transistor X3. That is, the concentration distribution of the p-type impurity in a depth direction is the same in the p-type well 111b including the channel of the peripheral circuit transistor Y and the p-type well 111a constituting the reset transistor X3 of the pixel section X described above.

In Embodiment 1, the impurity concentration of the p-type well 110b having the amplifying transistor described above formed therein is set to be lower than the impurity concentration of the p-type well 111a having the peripheral circuit transistor formed therein.

Next, the operation will be described.

The operation of the solid-state image capturing apparatus according to Embodiment 1 is the same as the operation of the conventional solid-state image capturing apparatus.

A signal charge generated in the pixel light receiving section X1 is transferred via the pixel transfer section X2 to the n+ type diffusion layer 108, which functions as a charge storing section (floating diffusion) FD and the signal charge is stored in the n+ type diffusion layer 108. The charge storing section FD generates a voltage signal in accordance with the stored signal charge. The voltage signal is applied to the gate 116 of the amplifying transistor X4, and the amplifying transistor 116 amplifies and outputs the voltage signal. When the reset transistor X3 is turned on during a period other than such a charge transfer period, the electric potential of the charge storing section FD described above is set to be a reset electric potential, which is the power supply electric potential Vd herein, and the power supply electric potential is amplified and outputted by the amplifying transistor X4. Thus, the reset voltage and the signal voltage outputted from the amplifying transistor X4 are signal-processed to determine a pixel value of each pixel.

At this stage, the vertical driving circuit of the peripheral circuit section Y (see FIG. 11(b)) generates a driving signal $\phi$ TX for the transfer gate 114 and a driving signal $\phi$ RX for the reset gate 115. The horizontal driving circuit of the peripheral circuit section Y (see FIG. 11(b)) selects a readout signal line for reading out a pixel signal, the load transistor group supplies electric current to each readout signal line, and the row signal storing section stores signals read out from the readout signal line of each column and successively outputs them.

Next, a manufacturing method will be described with reference to FIGS. 2 to 5.

First, a resist film 121 having an opening 121a with a predetermined pattern is formed on a surface of then-type semiconductor substrate 100 (FIG. 2(a)). Next, the surface of the semiconductor substrate is selectively etched using the resist film 121 as an etching mask to form an element separation trench 100a on the surface of the semiconductor substrate 100 (FIG. 2(b)). Herein, an Si substrate doped with phosphorus (P) is used as the n-type semiconductor substrate 100, and the substrate has an impurity concentration of about $1 \times 10^{14}$ to $1 \times 10^{15}/\text{cm}^{-3}$.

After the resist film 121 is removed, an oxide film 105a is accumulated on the entire surface (FIG. 2(c)), and the oxide film 105a is etched so as to expose the substrate surface by mechanical polishing and the like. Thus, an oxide film material is embedded in the element separation trench 100a on the substrate surface, and the element separation region 105 is formed. Due to the element separation region 105, desirable adjacent elements are electrically separated in the pixel section X described above and the peripheral circuit section Y.

Next, a p-type dopant, such as boron (B), is implanted into the entire surface of the semiconductor substrate 100 to form a p-type embedded semiconductor layer 101 in a deep region of the substrate 100 (FIG. 3(a)). The impurity concentration of the p-type semiconductor layer 101 is about $7 \times 10^{15}$ to $2 \times 10^{17}/\text{cm}^{-3}$. The p-type embedded semiconductor layer 101 in the pixel section X is to become a bottom portion of a p-type region for surrounding an n-type embedded diffusion region for accumulating electric charges. In addition, the p-type embedded semiconductor layer 101 in the peripheral circuit section Y is to electrically separate the n-type semiconductor substrate 100 and the n-type well region formed on the surface of the n-type semiconductor substrate 100. By providing the p-type embedded semiconductor layer 101, the n-type semiconductor substrate 100 and the well region on the surface of the n-type semiconductor substrate 100 can be set to have different electric potentials. For example, the well region can be set to have an electric potential lower than that of the substrate.

Next, a resist film 122 is formed on the substrate 100. The resist film 122 has an opening 122a that is formed in such a manner that a region for forming a photodiode (pixel light receiving section X1) in the pixel section X on the surface of the substrate 100 is exposed. An n-type dopant, such as arsenic (As), is implanted using the resist film 122 as an ion implantation mask to form an n-type diffusion region 102 in the pixel light receiving section X1 (FIG. 3(b)). The n-type diffusion region 102 has a concentration of about $1 \times 10^{17}$ to $4 \times 10^{17}/\text{cm}^{-3}$.

After the resist film 122 is removed, a resist film 123 is formed on the substrate 100. The resist film 123 has an opening 123a that is formed in such a manner that a region for arranging a transfer transistor (pixel transferring section X2) in the pixel section X on the surface of the substrate 100 is exposed. A p-type dopant, such as boron (B), is implanted using the resist film 123 as an ion implantation mask to form a p-type diffusion region (p-type well) 104 in a region to be the pixel transferring section X2 (FIG. 4(a)). The p-type well 104 has a concentration of about $3 \times 10^{16}$ to $1 \times 10^{17}/\text{cm}^{-3}$.

After the resist film 123 described above is removed, a resist film 124 is formed on the substrate 100. The resist film 124 has an opening 124a that is formed in such a manner that regions for forming an element separation section of the pixel section X on the surface of the substrate 100, and the amplifying transistor X4 are exposed. A p-type dopant, such as boron (B), is implanted using the resist film 124 as an ion implantation mask to form a p-type diffusion region 110a so as to cover the side and the bottom of the element separation section 105 and to form a p-type well 110b in a forming region for the amplifying transistor X4 (FIG. 4(b)). The p-type diffusion region 110a and p-type well 110b have a concentration of about $1 \times 10^{17}$ to $3 \times 10^{17}/\text{cm}^{-3}$.

After the resist film 124 is removed, a resist film 125 is formed on the substrate 100 described above. The resist film 125 has an opening 125a that is formed in such a manner that a region for forming a reset transistor of the pixel section X on the surface of the substrate 100, and a region for forming a peripheral circuit transistor Y1 of the peripheral circuit section Y are exposed. A p-type dopant, such as boron (B), is implanted using the resist film 125 as an ion implantation mask to form a p-type diffusion region (p-type well) 111a in a region to form the reset transistor and to form a p-type diffusion region (p-type well) in a region for forming a peripheral circuit transistor Y1 of the peripheral circuit section Y (FIG. 5(a)). The p-type diffusion regions 111a and 111b have a concentration of about $1 \times 10^{17}$ to $3 \times 10^{17}/\text{cm}^{-3}$.

After the resist film 125 is removed, a gate insulation film 106 is formed by thermal oxidation. Subsequently, the transfer gate 114 is formed in the pixel transfer section X2. The reset Tr gate 115 is formed in a region for forming the reset transistor X3. The amplifying Tr gate 116 is formed in a region for forming the amplifying transistor X4, and the gate 117 is formed in the peripheral circuit section Y, namely a region for forming the peripheral circuit transistor Y1.

Subsequently, while the pixel transfer section X2, the region for forming the reset transistor X3, the region for forming the amplifying transistor X4, and the region for forming the peripheral circuit transistor Y1 are masked by a resist film (not shown), a p-type dopant (B) is selectively implanted into the pixel light receiving section X1 to form the p+ type diffusion layer 103 on the surface of the n-type diffusion layer 102 of the pixel light receiving section X1. Further, while the pixel light receiving section X1 is masked by a resist film (not shown), an n-type dopant (As) is implanted using the gate of each transistor so as to form the n+ type diffusion regions 108, 115b, 116a, 116b, 117a and 117b, which function as source regions and drain regions on both sides of each gate (FIG. 5(b)). The source region and the drain region of each transistor have a concentration of about $5 \times 10^{19}$ to $5 \times 10^{20}/\text{cm}^{-3}$, and the p+ type diffusion layer 103 of the pixel light receiving section X1 has a concentration of about $5 \times 10^{17}$ to $5 \times 10^{18}/\text{cm}^{-3}$.

According to the solid-state image capturing apparatus of Embodiment 1 with the structure described above, the p-type well (p-type diffusion region) 110b for arranging the amplifying transistor X4 is formed in a ion implantation step different from that of the p-type well (p-type diffusion region) 111b for forming the peripheral circuit transistor Y1. Therefore, it is possible to set the well implantation profile of the amplifying transistor in the pixel section independently from the peripheral circuit transistor. As a result, the arrangement region (p-type well) for the amplifying transistor X4, which constitutes an analog circuit in the pixel section, is able to have a concentration profile, namely an impurity concentration profile in a depth direction, independent from the arrangement region (p-type well) for a transistor, which constitutes a peripheral circuit that is a digital circuit.

In addition, the p-type well (p-type diffusion region) 110b for arranging the amplifying transistor X4 is formed at the time of performing the separation ion implantation to form the p-type diffusion layer 110a that functions as a leak stopper in the STI element separation section. Therefore, the region in the well of the pixel section for implanting ion can be expanded. In addition, the phenomenon of increasing the threshold voltage $V_T$ can be controlled by implanting ion in the well of the pixel region by a minute pattern.

As a result, due to the lowered concentration of the p-type semiconductor region (p-type well) for arranging the amplifying transistor, the substrate bias effect can be decreased and the gain of the source follower amplifier can be increased, thereby improving the characteristics of an SF amplifier without adding more manufacturing steps.

Figure 6:
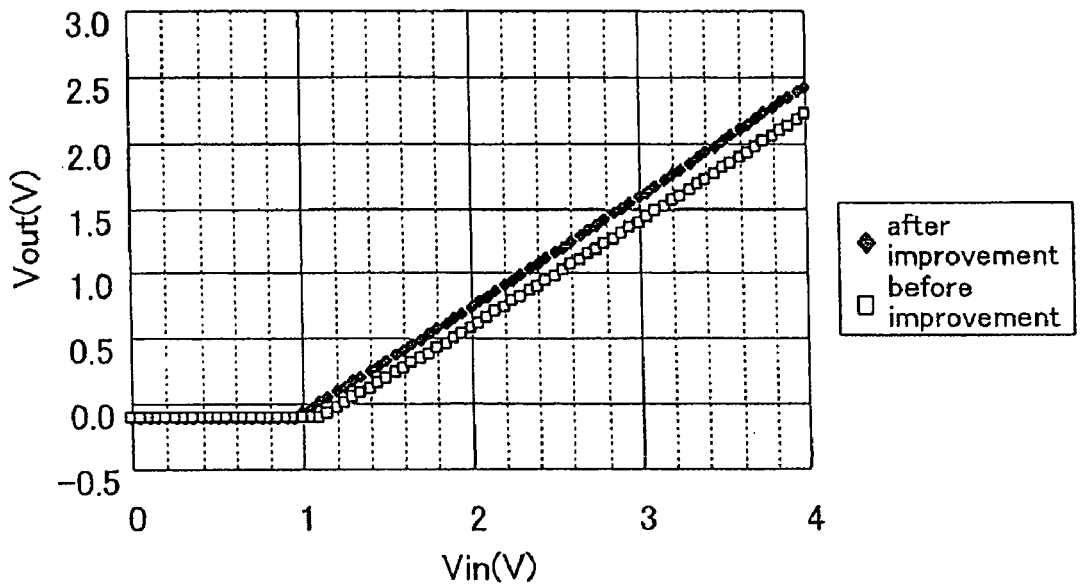
FIG. 6 is a diagram explaining an effect of the solid-state image capturing apparatus according to Embodiment 1, showing an output characteristic of a source follower amplifier.
Figure 7:
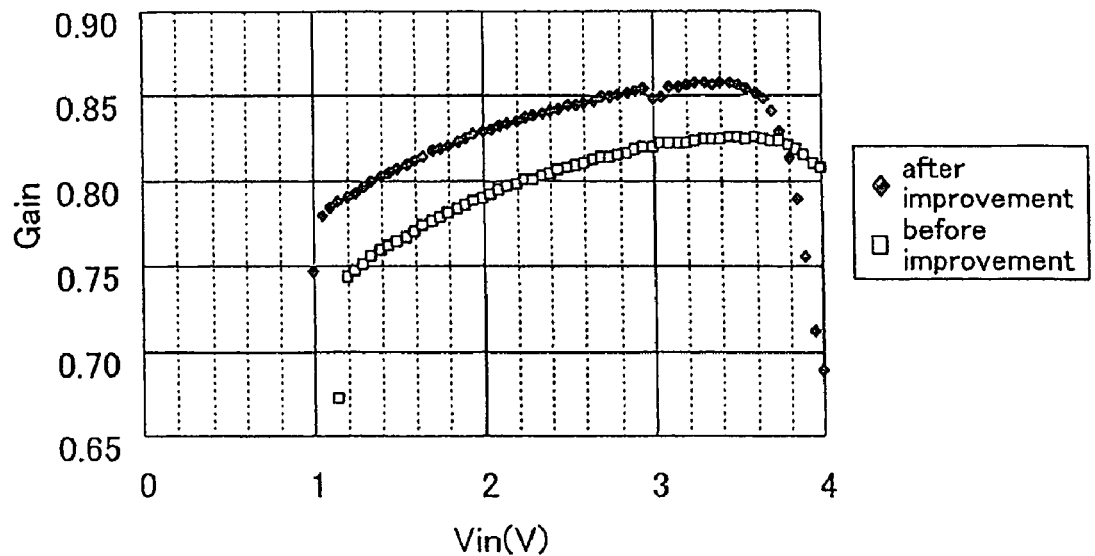
FIG. 7 is a diagram explaining an effect of the solid-state image capturing apparatus according to Embodiment 1, showing a gain characteristic of a source follower amplifier.

For example, the output characteristics of the source follower amplifier, which the amplifier transistor X4 of the pixel section constitutes, is improved as shown in FIG. 6. In addition, the gain characteristic of the source follower amplifier is improved as shown in FIG. 7.

Further, the arrangement region (p-type well) 111a for the reset transistor X3 in the pixel section X and the arrangement region (p-type well) 111b for the peripheral circuit transistor Y in the peripheral circuit section Y are formed by the same ion implantation step using the same ion implantation mask, and therefore, the ion implantation step can be simplified.

In addition, with regard to the gate, source region and drain region of the transistor, the transistor constituting the pixel section X and the transistor constituting the peripheral circuit section Y are formed under the same conditions. That is, the forming material for the gate and the impurity profile for the source and drain regions are set to be the same. Therefore, the ion implantation step can be further simplified.

Although not specifically described in Embodiment 1 described above, the p-type wells 104, 110a, 110b, 111a and 111b can be formed by performing ion implantation for multiple times by changing ion implantation energy and the dose volume of the impurity, so that the impurity concentration profile of the p-type wells in a depth direction can be set more accurately to a desired profile.

Embodiment 2

Figure 8:
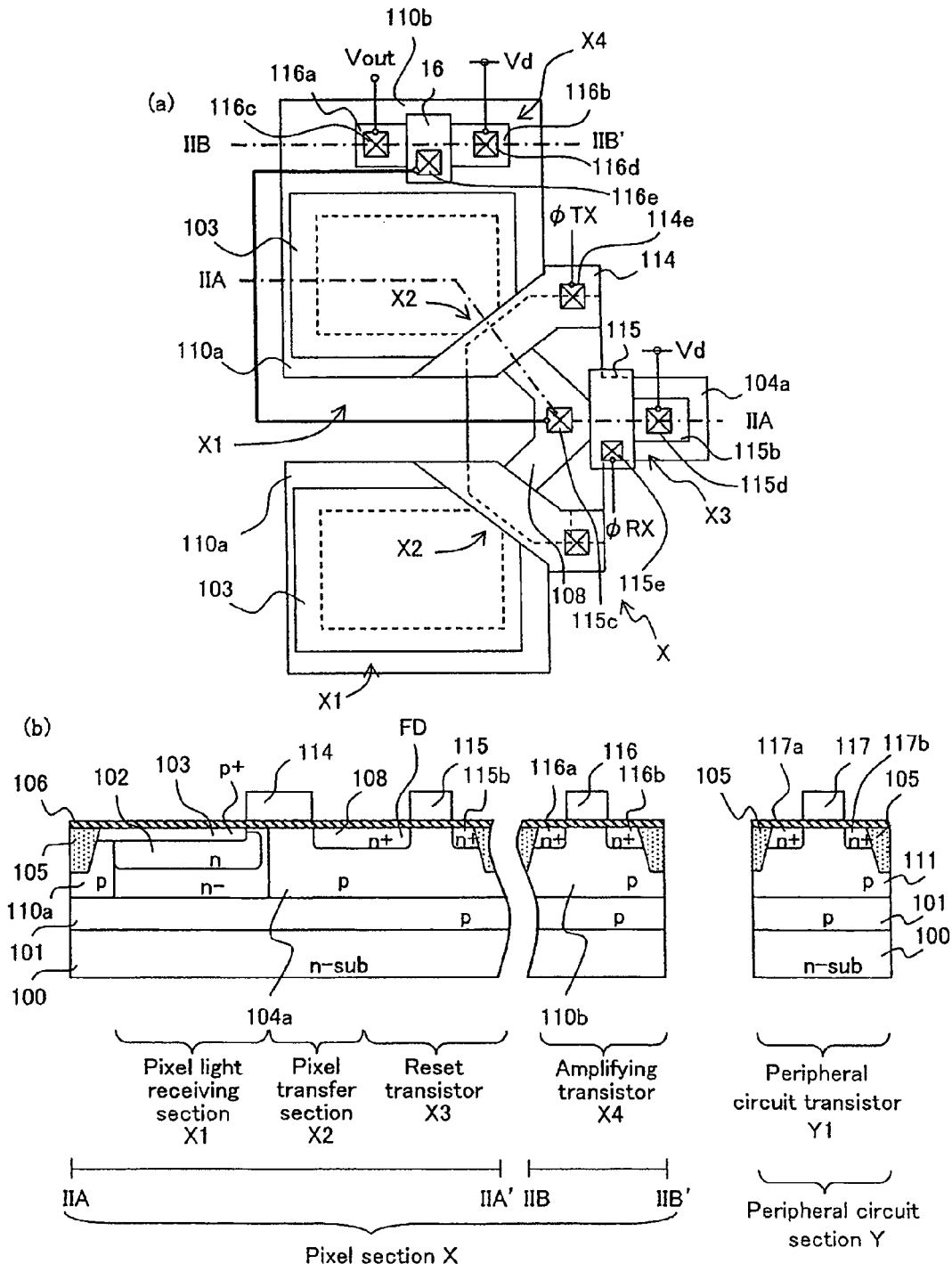
FIG. 8 is a diagram illustrating a solid-state image capturing apparatus according to Embodiment 2 of the present invention.

FIG. 8 is a diagram illustrating a solid-state image capturing apparatus according to Embodiment 2 of the present invention. FIG. 8(a) shows a plan structure of a pixel, and FIG. 8(b) shows a cross sectional structure along the line IIA-IIA' in FIG. 8(a), a cross sectional structure along the line IIB-IIB' in FIG. 8(a), and a cross sectional structure of a peripheral circuit transistor in a peripheral circuit section.

Similar to the solid-state image capturing apparatus according to Embodiment 1, the solid-state image capturing apparatus according to Embodiment 2 includes a pixel section X having pixels arranged in a matrix therein, and a peripheral circuit section Y arranged in the periphery of the pixel section X and for driving each pixel in the pixel section.

Similar to the pixels that constitute the pixel section X of Embodiment 1, each pixel that constitutes the pixel section X according to Embodiment 2 includes: a pixel light receiving section X1 for receiving incident light to generate a signal charge; a pixel transfer section X2 for transferring the signal charge to a charge storing section (floating diffusion section) FD; a reset transistor section X3 for resetting an electric potential of the charge storing section FD to a reset electric potential; and an amplifying transistor X4 for converting the signal charge of the charge storing section FD into a voltage signal, amplifying and outputting the voltage signal. However, the pixels according to Embodiment 2 are different from the pixels according to Embodiment 1 in that the pixel transfer section X2 and the reset transistor X3 are formed in the same p-type well 104a (p-type diffusion region), and a p-type well 104a for arranging a reset transistor X of the pixel section X3 and a p-type well 111 for arranging a peripheral circuit transistor Y1 of a peripheral circuit section Y are formed by different ion implantation steps to make the respective concentration profiles in a depth direction different from each other.

The operation of the solid-state image capturing apparatus according to Embodiment 2 is performed in a similar manner as that of Embodiment 1.

Next, a manufacturing method will be described.

According to Embodiment 2, the processes are the same as those in Embodiment 1 up to forming a p-type semiconductor layer 101 on an n-type semiconductor substrate 100, forming an element separation region 105, and subsequently forming an n-type diffusion region 102 in a region for forming a photodiode. Therefore, steps that follow the above steps will be described herein.

Figure 9:
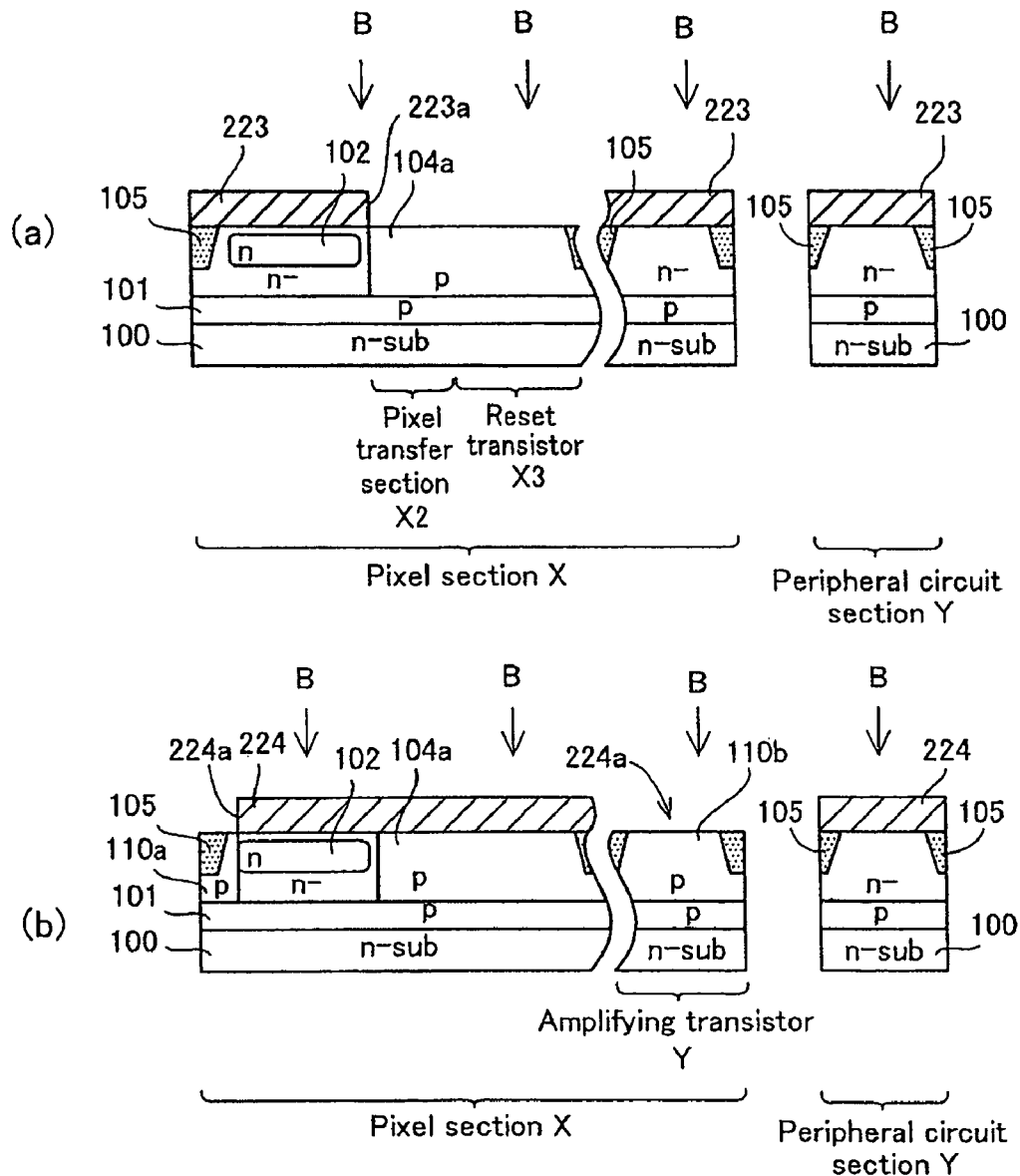
FIG. 9 is a cross sectional view illustrating a manufacturing method for the solid-state image capturing apparatus according to Embodiment 2, showing a step of forming a well for arranging a pixel transfer section and a reset transistor (FIG. 9(a)) and a step of forming a well for arranging an amplifying transistor (FIG. 9(b)).

As described above, after the n-type diffusion region 102 is formed in the pixel light receiving section X1 (see FIG. 3(b)) and the resist film 122 is removed, a resist film 223 is formed on the substrate 100. The resist film 223 has an opening 223a formed in such a manner that a region to be a pixel transfer section X2, and an arrangement region of a reset transistor X3 in a pixel section X on the surface of the substrate 100 are exposed. A p-type dopant, such as boron, is ion-implanted using the resist film 223 as an ion-implantation mask to form a p-type diffusion region 104a in a region to be the pixel transfer section X2 and a region to be the reset transistor X3 (FIG. 9(a)). The p-type diffusion region 104a has an impurity concentration of about $3\times10^{16}$ to $1\times10^{17}/cm^{-3}$.

After the resist film 223 described above is removed, a resist film 224 is formed on the substrate 100. The resist film 224 has an opening 224a formed in such a manner that an element separation section in the pixel section X on the surface of the substrate 100, and a region for forming an amplifying transistor X4 are exposed. A p-type dopant, such as boron, is ion-implanted using the resist film 224 as an ion implantation mask to form a p-type diffusion layer 110a to cover the side and bottom of the element separation section 105, and a p-type well 110b is formed in a region for forming the amplifying transistor X4 (FIG. 9(b)). The p-type diffusion regions 110a and 110b have an impurity concentration of about $1\times10^{17}$ to $3\times10^{17}/cm^{-3}$.

Figure 10:
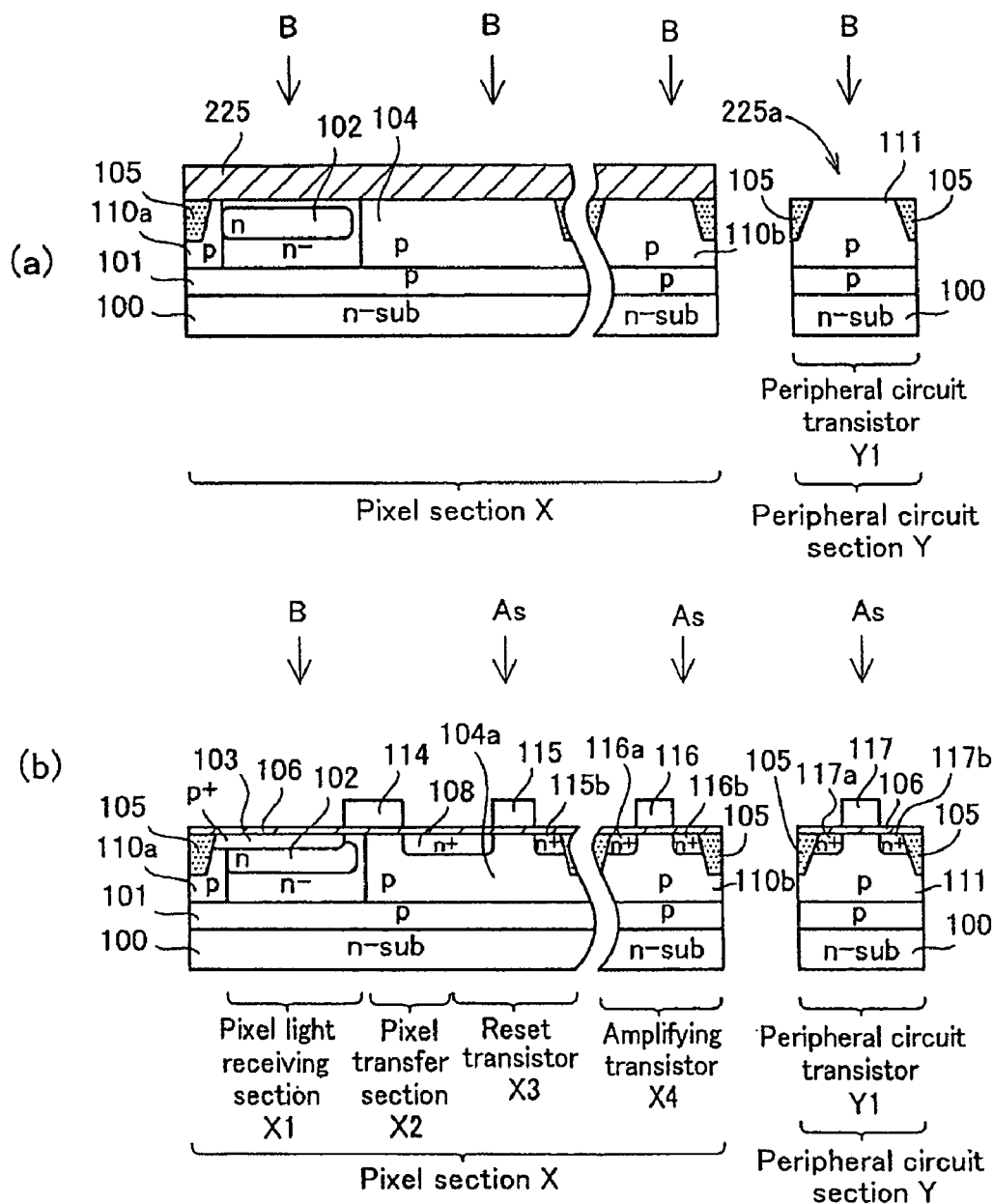
FIG. 10 is a cross sectional view illustrating a manufacturing method for the solid-state image capturing apparatus according to Embodiment 1, showing a step of forming a well for arranging a peripheral circuit transistor (FIG. 10(a)) and a step of forming a p-type diffusion region that constitutes a gate electrode and a diffusion region of the transistor, and a pixel light receiving section (FIG. 10(b)).
Figure 12:
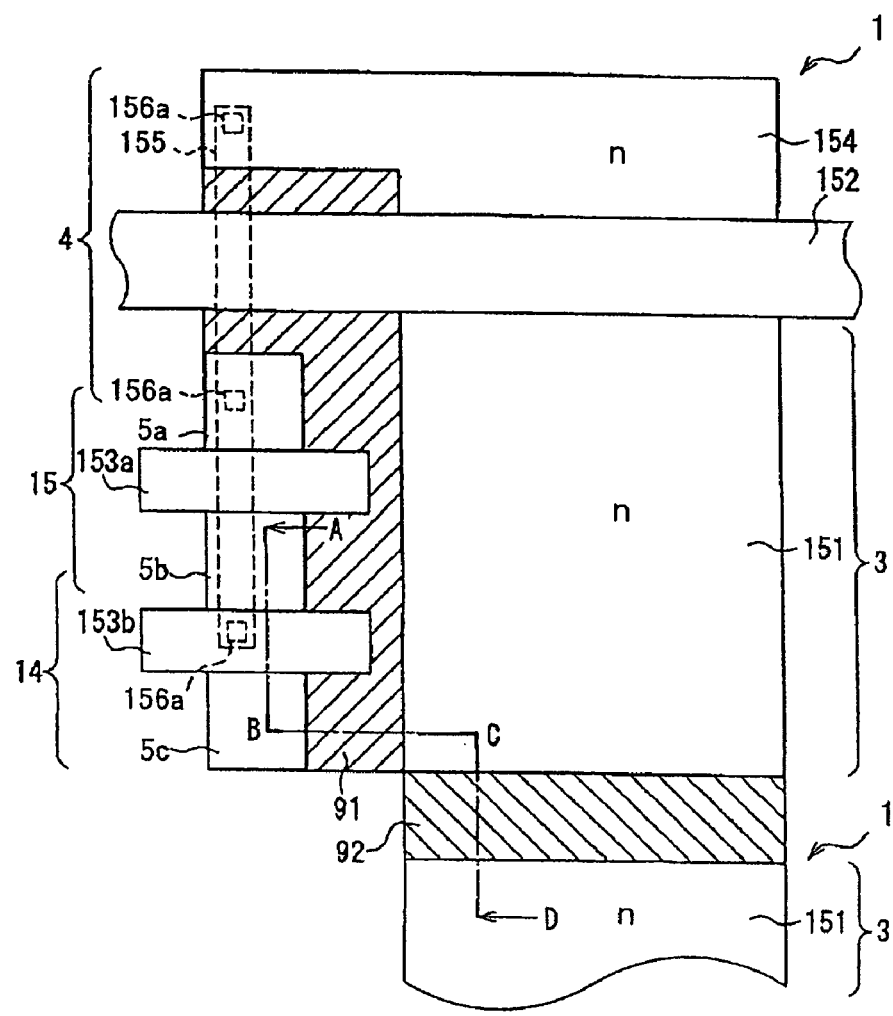
FIG. 12 is a diagram showing a plan view structure of a pixel shown in FIG. 11(b).
Figure 13:
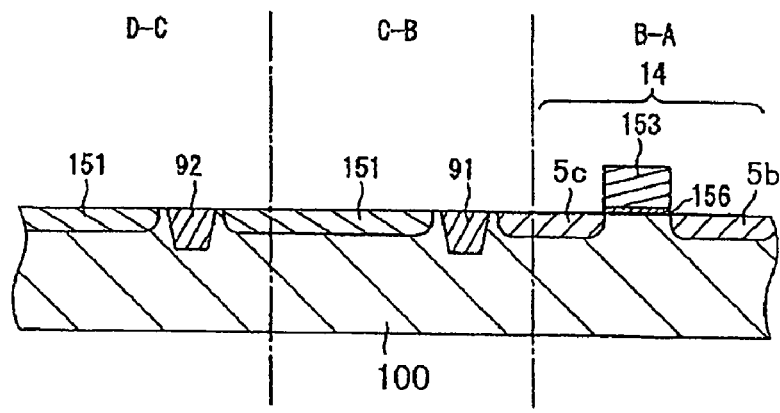
FIG. 13 is a cross sectional view showing an enlarged portion of the conventional solid-state image capturing apparatus shown in FIG. 12, showing cross sections along the lines indicated by A-B-C-D in FIG. 12.
Figure 14:
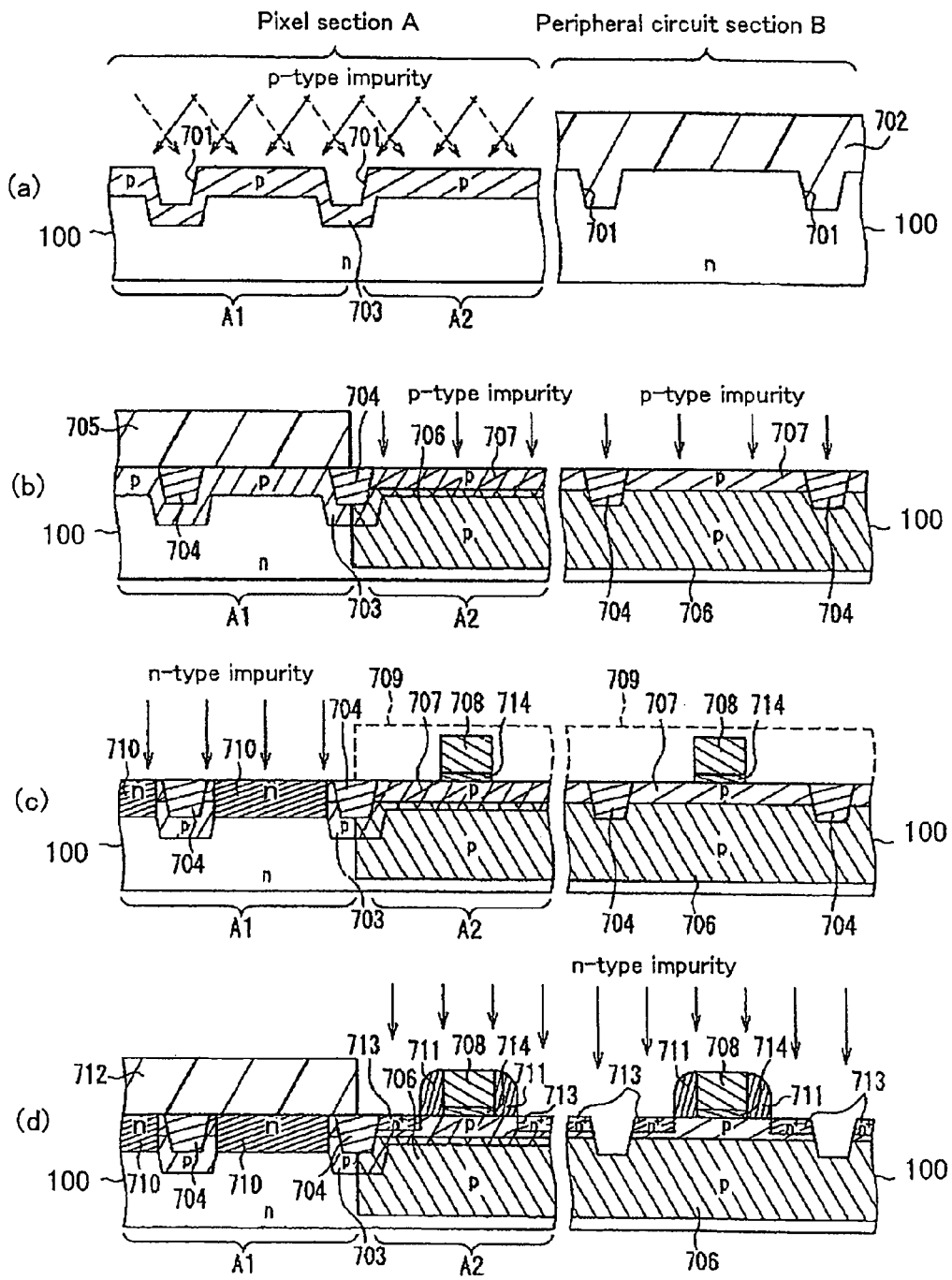
FIG. 14 is a cross sectional view showing manufacturing steps of the conventional MOS type solid-state image capturing apparatus having an STI leak stopper formed therein, where
Figure 15:
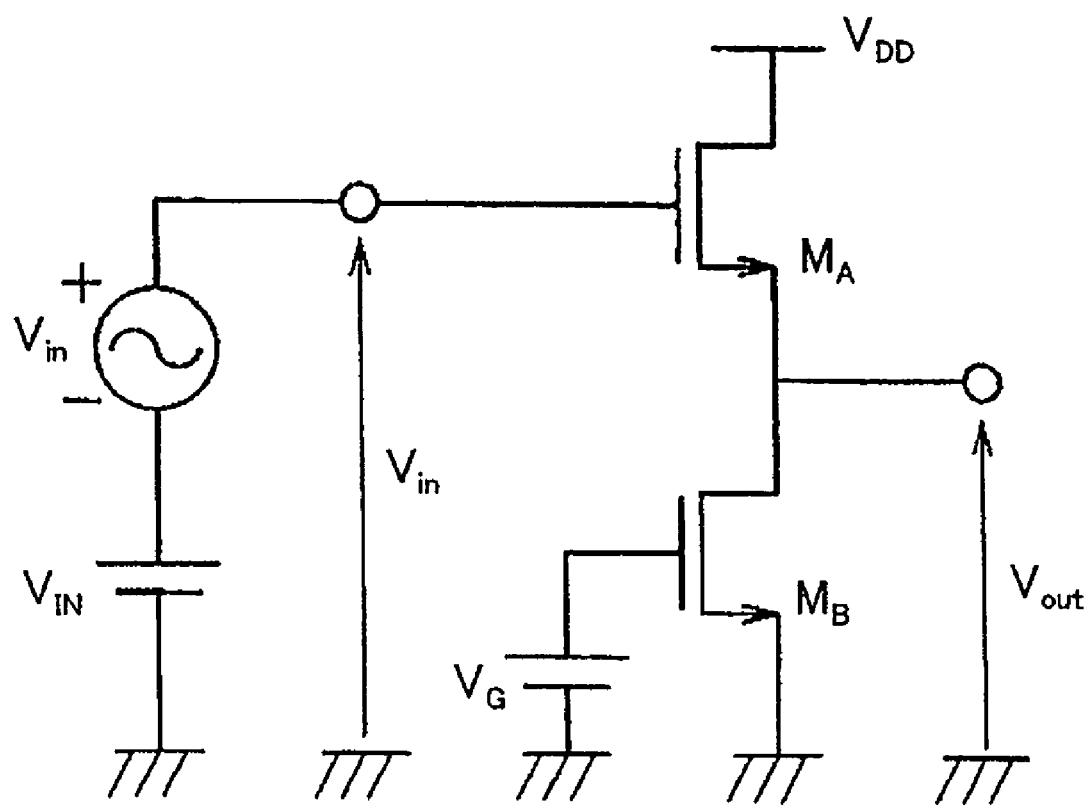
FIG. 15 is a circuit diagram illustrating a circuit structure of a basic source follower circuit.

After the resist film 224 described above is removed, a resist film 225 is formed on the substrate 100 described above. The resist film 225 has an opening 225a formed in such a manner that a region for forming a peripheral circuit transistor Y1 in a peripheral circuit section Y on the surface of the substrate 100 is exposed. A p-type dopant, such as boron, is ion-implanted using the resist film 225 as an ion implantation mask to form a p-type diffusion layer 111 (p-type well) in the region for forming the peripheral circuit transistor Y1 in the peripheral circuit region Y (FIG. 10(a)). The p-type diffusion region 111 has an impurity concentration of about $1\times10^{17}$ to $3\times10^{17}/cm^{-3}$.

After the resist film 225 described above is removed, a gate insulation film 106 is formed in a similar manner as that of Embodiment 1. Further, a transfer gate 114, a reset Tr gate 115, an amplifying Tr gate 116, and a gate 117 of a peripheral circuit transistor Y1 are formed.

Further, similar to Embodiment 1, a p+ type diffusion layer 103 of the pixel light receiving section X1 is formed on the surface of the n-type diffusion layer 102 in the pixel light receiving section X1. Further, n+ type diffusion regions 108, 115b, 116a, 116b, 117a, and 117b are formed, the n+ type diffusion regions functioning as source regions and drain regions of respective transistors. Herein, the source regions and drain regions of the respective transistors have an impurity concentration of about $5\times10^{19}$ to $5\times10^{20}/cm^{-3}$. The p+ type diffusion layer 103 of the pixel light receiving section X1 has an impurity concentration of about $5\times10^{17}$ to $5\times10^{18}/cm^{-3}$.

According to the solid-state image capturing apparatus of Embodiment 2 with the structure described above, the p-type well 111, which constitutes the peripheral circuit transistor Y1, the p-type well 104a, which constitutes the reset transistor X3, and the well 110b, in which the amplifying transistor X4 is arranged, each have concentration profiles that are different from one another. Therefore, the characteristics of the amplifying transistor can be different from those of the peripheral circuit transistor and the reset transistor.

In addition, the p-type well (p-type diffusion region) 110b for arranging the amplifying transistor X4 is formed at the separation ion implantation for forming the p-type diffusion layer 110a, which functions as a leak stopper of the STI element separation section, and further, the pixel transfer section X2 and the reset transistor X3 in the pixel section X are arranged in the same p-type well 104a. Therefore, the ion implantation step can be simplified.

Although not specifically described in Embodiment 2 described above, the p-type wells 104, 110a, 110b, and 111 can be formed by performing ion implantation for multiple times by changing ion implantation energy and the dose volume of the impurity, so that the impurity concentration profile of the p-type wells in a depth direction can be set more accurately to a desired profile.

Embodiment 3

Although not specifically described in Embodiment 1 or 2 described above, an electronic information device will be described hereinafter. The electric information device, such as a digital camera (e.g., digital video camera and digital still camera), an image input camera, a scanner, a facsimile machine and a camera-equipped cell phone device, has an image capturing section using at least one of the solid-state image capturing apparatuses according to Embodiments 1 and 2 described above as an image input device.

Figure 16:
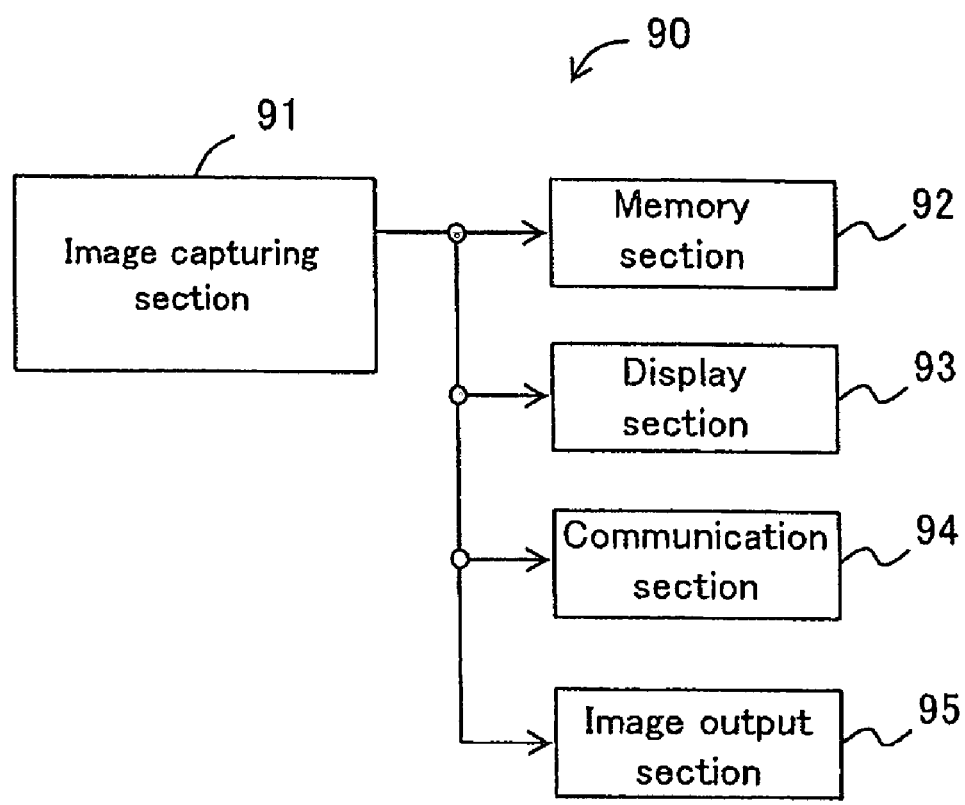
FIG. 16 is a block diagram showing an exemplary simplified structure of an electric information device using the solid-state image capturing apparatus according to Embodiment 1 or 2 as an image capturing section, as Embodiment 3 of the present invention.

FIG. 16 is a block diagram showing an exemplary simplified structure of an electric information device using the solid-state image capturing apparatus according to Embodiment 1 or 2 as an image capturing section, as Embodiment 3 of the present invention.

The electronic information device 90 according to Embodiment 3 of the present invention, which is shown in FIG. 16, includes an image capturing section 91 using at least either of the solid-state image capturing apparatuses according to Embodiments 1 and 2, and further using at least any of: a memory section 92 (e.g., recording media) for data-recording a high-quality image data obtained by the image capturing section after a predetermined signal process is performed on the image data for recording; a display section 93 (e.g., liquid crystal display device) for displaying this image data on a display screen (e.g., liquid crystal display screen) after a predetermined signal process is performed for display; a communication section 94 (e.g., transmitting and receiving device) for communicating this image data after a predetermined signal process is performed on the image data for communication; and an image output section 95 for printing (typing out) and outputting (printing out) this image data.

As described above, the present invention is exemplified by the use of its preferred Embodiments 1 to 3. However, the present invention should not be interpreted solely based on Embodiments 1 to 3 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 3 of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied in the field of a solid-state image capturing apparatus, a manufacturing method of the solid-state image capturing apparatus, and an electronic information device, such as a digital still camera, a digital movie camera and a camera-equipped cell phone device, using the solid-state image capturing apparatus in the image capturing section. According to the present invention, it is possible to set a concentration profile of a forming region of an amplifying transistor that constitutes a pixel independently from a concentration profile of a forming region of a transistor that constitutes a circuit around the pixel, so that a leak stopper prevents a leak current from an element separation section to a photodiode so as to control uneven display irregularity while improving the output characteristics of a source follower circuit better than before.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state image capturing apparatus, comprising:
    a first-conductivity type semiconductor substrate;
    a pixel section obtained by forming a plurality of pixels on the semiconductor substrate; and
    a peripheral circuit section obtained by forming a peripheral circuit for driving the pixels in a region of the semiconductor substrate, the region being located around the pixel section,
    wherein each of the pixels comprises:
        a pixel light receiving section for converting incident light into a signal charge by photoelectric conversion;
        a charge storing section for storing the signal charge and generating a signal voltage in accordance with the stored signal charge; and
        an amplifying transistor for amplifying and outputting the signal voltage,
    wherein the semiconductor substrate includes a second-conductivity type semiconductor region, in which the amplifying transistor is formed, the second-type semiconductor region having an impurity concentration profile different from an impurity concentration of a second-conductivity type semiconductor region, in which a peripheral circuit transistor that constitutes the peripheral circuit is formed.

2. A solid-state image capturing apparatus according to claim 1,
    wherein the second-conductivity type semiconductor region, in which the amplifying transistor is formed, on the semiconductor substrate has an impurity concentration lower than an impurity concentration of the second-conductivity type semiconductor region, in which the peripheral circuit transistor that constitutes the peripheral circuit is formed.

3. A solid-state image capturing apparatus according to claim 1,
wherein each of the pixels has a reset transistor for resetting a signal charge stored in the charge storing section, and a second-conductivity type semiconductor region, in which the reset transistor is formed, on the semiconductor substrate is formed with the same ion implantation treatment for the second-conductivity type semiconductor region, in which a peripheral circuit transistor that constitutes the peripheral circuit is formed.

4. A solid-state image capturing apparatus according to claim 3,
wherein the semiconductor substrate includes an element separation section formed by embedding an insulation material in a trench formed on the surface of the semiconductor substrate, and a second-conductivity type leak stopper formed in the semiconductor substrate so as to cover a side and a bottom of the element separation section, for preventing a leak current from flowing from the element separation section to a peripheral semiconductor region thereof, and
wherein the second-conductivity semiconductor region, in which the amplifying transistor is arranged, is formed with the same ion implantation treatment for the second-conductivity type leak stopper.

5. A solid-state image capturing apparatus according to claim 4,
wherein each of the pixels has a transfer transistor formed between the pixel light receiving section and the charge storing section, for transferring a signal charge generated in the pixel light receiving section to the charge storing section, and
wherein a second-conductivity type semiconductor region, which constitutes a channel region of the transfer transistor, on the semiconductor substrate has an impurity concentration profile different from the impurity concentration profile of the second-conductivity type semiconductor region, in which the reset transistor is formed.

6. A solid-state image capturing apparatus according to claim 1,
wherein each of the pixels has a reset transistor for resetting a signal charge stored in the charge storing section, and
wherein a second-conductivity type semiconductor region, in which the reset transistor is formed, on the semiconductor substrate has an impurity concentration profile different from the impurity concentration profile of the second-conductivity type semiconductor region, in which the peripheral circuit transistor that constitutes the peripheral circuit is formed, and different from the impurity concentration profile of the second-conductivity type semiconductor region, in which the amplifying transistor is formed.

7. A solid-state image capturing apparatus according to claim 6,
wherein the semiconductor substrate includes an element separation section formed by embedding an insulation material in a trench formed on the surface of the semiconductor substrate, and a second-conductivity type leak stopper formed in the semiconductor substrate so as to cover sides and a bottom of the element separation section for preventing a leak current from flowing from the element separation section to a peripheral semiconductor region, and
wherein the second-conductivity semiconductor region, in which the amplifying transistor is formed, is formed with the same ion implantation treatment for the second-conductivity type leak stopper.

8. A solid-state image capturing apparatus according to claim 7,
wherein each of the pixels has a transfer transistor formed between the pixel light receiving section and the charge storing section, for transferring a signal charge generated in the pixel light receiving section to the charge storing section, and
wherein a channel region of the transfer transistor is formed in the second-conductivity type semiconductor region in which the reset transistor is formed.

9. A solid-state image capturing apparatus according to claim 1, wherein a transistor in the pixel section constitutes an analog signal processing circuit, and the peripheral circuit transistor in the peripheral circuit section constitutes a digital signal processing circuit.

10. A solid-state image capturing apparatus according to claim 1, wherein the first-conductivity type semiconductor substrate is an n-type silicon substrate doped with phosphorus, and the second-conductivity type semiconductor region is a p-type semiconductor region implanted with boron.

11. A manufacturing method for a solid-state image capturing apparatus, the solid-state image capturing apparatus comprising a pixel section, which comprises a plurality of pixels, and a peripheral circuit section, which comprises a peripheral circuit for driving the pixel, each of the pixels comprising a pixel light receiving section for converting incident light into a signal charge by photoelectric conversion; a charge storing section for storing the signal charge and generating a signal voltage in accordance with the stored signal charge; and an amplifying transistor for amplifying and outputting the signal voltage, the manufacturing method comprising:
a first ion implantation step of selectively ion-implanting a second-conductivity type impurity in a surface region of a first-conductivity type semiconductor substrate so as to form a first second-conductivity type semiconductor region, in which the amplifying transistor is to be formed; and
a second ion implantation step of selectively ion-implanting the second-conductivity type impurity in the surface region of the first-conductivity type semiconductor substrate with an ion implantation condition that is different from the first ion implantation step, so as to form a second second-conductivity type semiconductor region in which a peripheral circuit transistor that constitutes the peripheral circuit is to be formed.

12. A manufacturing method for a solid-state image capturing apparatus according to claim 11, wherein
a first ion implantation mask is used in the first ion implantation step; and
a second ion implantation mask, which has a mask opening pattern different from a mask opening pattern of the first ion implantation mask, is used in the second ion implantation step.

13. A manufacturing method for a solid-state image capturing apparatus according to claim 12, wherein the first second-conductivity type semiconductor region, in which the amplifying transistor is to be formed, has an impurity concentration profile that is different from an impurity concentration profile of the second second-conductivity type semiconductor region, in which the peripheral circuit transistor is to be formed.

14. A manufacturing method for a solid-state image capturing apparatus according to claim 13, wherein the first second-conductivity type semiconductor region, in which the amplifying transistor is to be formed, has the impurity concentration profile lower than the impurity concentration profile of the second second-conductivity type semiconductor region, in which the peripheral circuit transistor is to be formed.

15. A manufacturing method for a solid-state image capturing apparatus according to claim 11,
wherein each of the pixels has a reset transistor for resetting a signal charge stored in the charge storing section,
and the second ion implantation step forms a third second-conductivity type semiconductor region, in which the reset transistor is to be formed, with the same ion implantation condition for the second second-conductivity type semiconductor region, in which the peripheral circuit transistor is to be formed, and using the same ion implantation mask.

16. A manufacturing method for a solid-state image capturing apparatus according to claim 11, further including an element separation step of forming a trench selectively on the surface of the semiconductor substrate and embedding an insulation material in the trench to form an element separation section,
wherein the first ion implantation step forms, in the semiconductor substrate, a second-conductivity type leak stopper which covers sides and a bottom of the element separation section and the first second-conductivity type semiconductor region, in which the amplifying transistor is to be formed, with the same ion implantation condition and using the same ion implantation mask.

17. A manufacturing method for a solid-state image capturing apparatus according to claim 15,
wherein each of the pixels has a transfer transistor formed between the pixel light receiving section and the charge storing section, for transferring a signal charge generated in the pixel light receiving section to the charge storing section, and
the method including a third ion implantation step of forming a fourth second-conductivity type semiconductor region, which constitutes a channel region of the transfer transistor, using an ion implantation mask that is different from the ion implantation masks used in any of the first and second ion implantation steps.

18. A manufacturing method for a solid-state image capturing apparatus according to claim 17,
wherein the fourth second-conductivity type semiconductor region, which constitutes the channel region of the transfer transistor, has an impurity concentration profile that is different from the impurity concentration profile of the third second-conductivity type semiconductor region, in which the reset transistor is to be formed.

19. A manufacturing method for a solid-state image capturing apparatus according to claim 11,
wherein each of the pixels has a reset transistor for resetting a signal charge stored in the charge storing section, and
the method including a fourth ion implantation step of forming a third second-conductivity type semiconductor region, in which the reset transistor is to be formed, using an ion implantation mask that is different from the ion implantation masks used in any of the first and second ion implantation steps.

20. A manufacturing method for a solid-state image capturing apparatus according to claim 19, wherein the third second-conductivity type semiconductor region, in which the reset transistor is to be formed, has an impurity concentration profile that is different from an impurity concentration profile of the second second-conductivity type semiconductor region, in which the peripheral circuit transistor is to be formed, and different from an impurity concentration profile of the first second-conductivity type semiconductor region, in which the amplifying transistor is to be formed.

21. A manufacturing method for a solid-state image capturing apparatus according to claim 19, further including an element separation step of selectively forming a trench on the surface of the semiconductor substrate and embedding an insulation material in the trench to form an element separation section,
wherein the first ion implantation step forms, in the semiconductor substrate, a second-conductivity type leak stopper which covers sides and a bottom of the element separation section and a first second-conductivity type semiconductor region, in which the amplifying transistor is to be formed, with the same ion implantation condition and using the same ion implantation mask.

22. A manufacturing method for a solid-state image capturing apparatus according to claim 21,
wherein each of the pixels has a transfer transistor formed between the pixel light receiving section and the charge storing section, for transferring a signal charge generated in the pixel light receiving section to the charge storing section, and
wherein the fourth ion implantation step forms the third second-conductivity type semiconductor region, in which the reset transistor is to be formed, in such a manner that the third second-conductivity type semiconductor region includes a channel region of the transfer transistor.

23. A manufacturing method for a solid-state image capturing apparatus according to claim 11, wherein the transistor in the pixel section constitutes an analog signal processing circuit, and the peripheral circuit transistor in the peripheral circuit section constitutes a digital signal processing circuit.

24. A manufacturing method for a solid-state image capturing apparatus according to claim 19, wherein the first-conductivity type semiconductor substrate is an n-type silicon substrate doped with phosphorus, and the second-conductivity type semiconductor region is a p-type semiconductor region implanted with boron.

25. An electronic information device equipped with an image capturing section, wherein a solid-state image capturing apparatus according to claim 1 is used as the image capturing section.

* * * * *